(12) United States Patent
Tani

(10) Patent No.: US 6,199,243 B1
(45) Date of Patent: Mar. 13, 2001

(54) DEVICE FOR CLEANING SCREEN PLATE USED IN SCREEN PRINTING

(75) Inventor: Okie Tani, Tokyo (JP)

(73) Assignee: Tani Electronics Industry Co., Ltd., Tokyo (JP)

(*) Notice: Subject to any disclaimer, the term of this patent is extended or adjusted under 35 U.S.C. 154(b) by 0 days.

(21) Appl. No.: 09/200,980

(22) Filed: Nov. 30, 1998

Related U.S. Application Data

(62) Division of application No. 08/602,295, filed on Feb. 16, 1996, now Pat. No. 5,901,405.

(30) Foreign Application Priority Data

| Feb. 18, 1995 | (JP) | 7-068525 |
| Feb. 27, 1995 | (JP) | 7-078073 |
| Nov. 1, 1995 | (JP) | 7-322576 |

(51) Int. Cl.[7] .................................................. B41F 35/00
(52) U.S. Cl. ..................... 15/302; 15/93.1; 15/256.52; 15/308; 101/425
(58) Field of Search ............................. 15/93.1, 93.4, 15/256.52, 302, 308; 101/425

(56) References Cited

U.S. PATENT DOCUMENTS

| 1,760,049 | 5/1930 | Ecker ............................. 101/425 X |
| 3,083,387 | * 4/1963 | Wilkins ................................ 15/93.1 |
| 3,706,108 | * 12/1972 | Taylor .............................. 15/308 X |
| 4,145,790 | 3/1979 | Wessells et al. ..................... 15/306.1 |
| 4,281,431 | * 8/1981 | Nierlich et al. ................... 15/93.1 X |
| 4,295,239 | * 10/1981 | Myochin ....................... 15/256.52 X |
| 4,369,544 | 1/1983 | Parisi ..................................... 15/320 |
| 4,389,936 | 6/1983 | Jaffa et al. ............................ 101/123 |
| 4,433,451 | 2/1984 | Parisi ..................................... 15/321 |
| 5,099,758 | 3/1992 | Hassler et al. ....................... 101/120 |
| 5,109,676 | * 5/1992 | Mohri et al. .................. 15/256.52 X |
| 5,197,384 | 3/1993 | Yawata et al. ....................... 101/123 |
| 5,271,325 | 12/1993 | Price et al. ....................... 101/425 X |
| 5,309,837 | 5/1994 | Nanzai ................................. 101/425 |
| 5,491,871 | * 2/1996 | Reber et al. ........................... 15/308 |

FOREIGN PATENT DOCUMENTS

| 2094072 | 10/1994 | (CA) . |
| 2123070 | 11/1994 | (CA) . |
| 39 28 525 | 3/1991 | (DE) . |
| 0 628 410 | 12/1994 | (EP) . |
| 2 281 053 | 2/1995 | (GB) . |
| 2-80250 | 3/1990 | (JP) . |
| 5-42669 | 2/1993 | (JP) . |
| 6-122190 | 5/1994 | (JP) . |
| 6-297696 | 10/1994 | (JP) . |

* cited by examiner

*Primary Examiner*—Chris K. Moore
(74) *Attorney, Agent, or Firm*—Foley & Lardner

(57) ABSTRACT

A cleaning device for cleaning a screen plate used in a screen printing is disclosed. The cleaning device comprises a base structure which can be placed just below the screen plate. A press member, such as a cleaning blade or cleaning roller is carried on the base structure. The press member has a contact portion which contacts a lower surface of the screen plate to scrape off any foreign things from the lower surface when the base structure is moved in a direction parallel with a major surface of the screen plate. In some embodiments, a cleaning paper wet with a solvent is intimately put between the contact portion of the press member and the lower surface of the screen plate to promote the cleaning effect.

16 Claims, 17 Drawing Sheets

FIG.6A FIG.6B
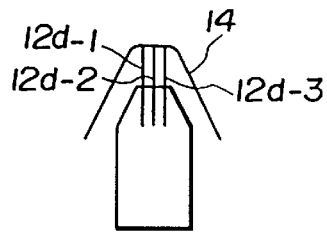 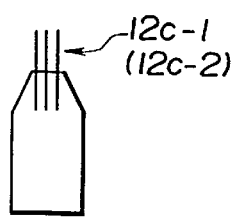
FIG.7
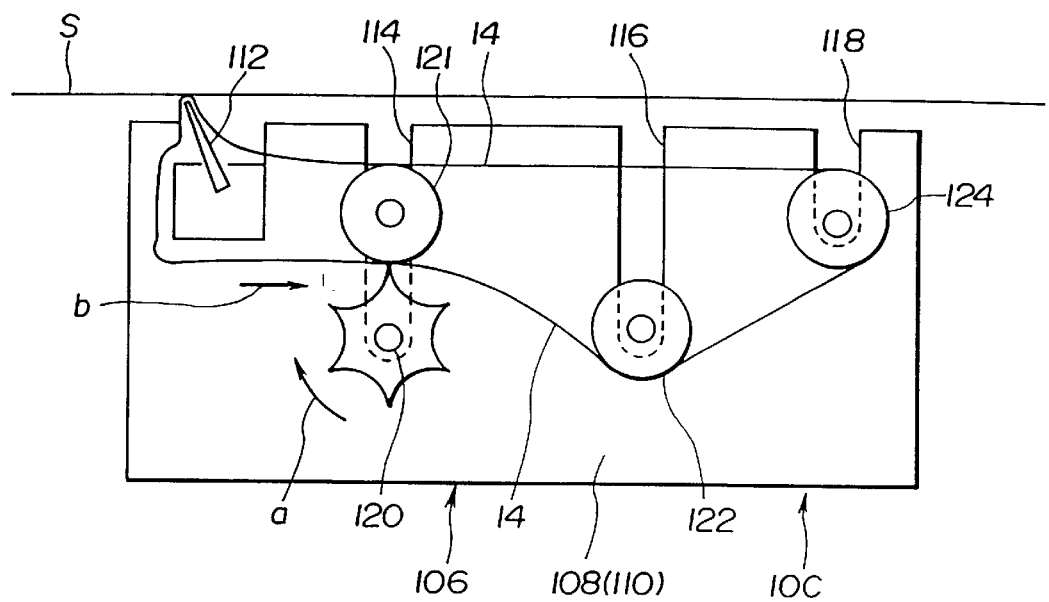
FIG.8
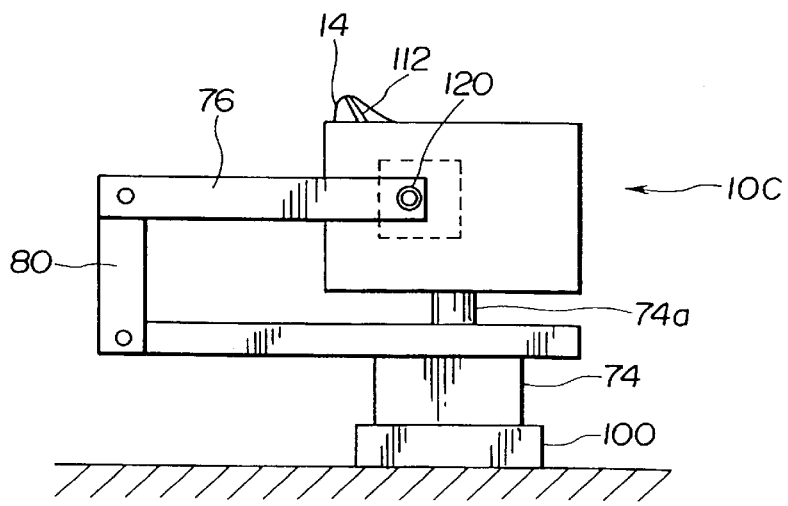

FIG.14
FIG.15
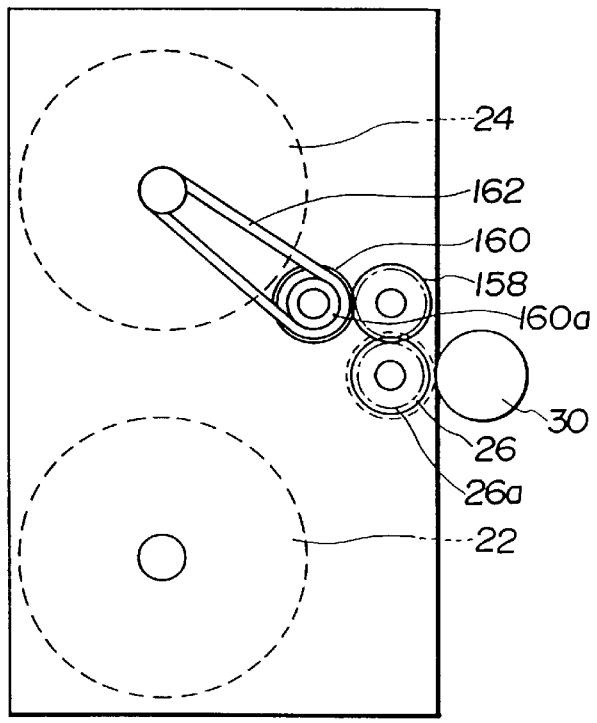
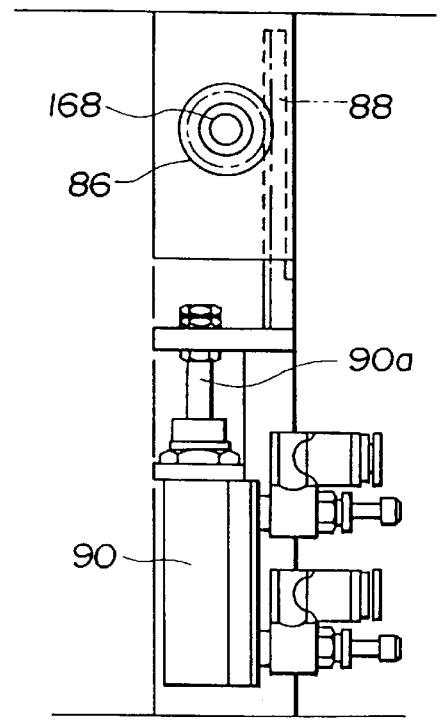

DEVICE FOR CLEANING SCREEN PLATE USED IN SCREEN PRINTING

This application is a divisional of application Ser. No. 08/602,295, filed Feb. 16, 1996, now U.S. Pat. No. 5,901,405, issued May 11, 1999.

BACKGROUND OF THE INVENTION

1. Field of the Invention

The present invention relates in general to screen printings and more specifically to a device for cleaning a screen plate used in the screen printing.

2. Description of the Prior Art

For printing electric circuit patterns on an insulating base board, a so-called "screen printing" has been hitherto used. The printing system employed in this printing comprises generally a screen plate (or mesh screen plate) which is put on an insulating base board to be printed, and a squeegee (viz., ink squeezing device) which runs on the screen plate while squeezing a given amount of viscous conductive ink onto the screen plate and pressing the screen plate against the insulating base board. With this, a desired circuit pattern of the conductive ink is printed on the surface of the insulating base board, which pattern coincides with a perforated print pattern defined by the screen plate. The base board thus printed is then removed from the screen plate and heated for fixing the printed circuit pattern. The screen plate is constructed of a stainless steel mesh or the like.

For improving the quality of the printed pattern on the base board, it is necessary to clean the screen plate at certain intervals. Hitherto, various cleaning devices have been proposed and put into practical use for such purpose. However, due to their inherent constructions, some of them fail to exhibit a satisfied cleaning effect and some are costly.

SUMMARY OF THE INVENTION

It is therefore an object of the present invention to provide a screen cleaning device for use in the screen printing, which is free of the above-mentioned drawbacks.

According to a first aspect of the present invention, there is provided a cleaning device for cleaning a screen plate used in a screen printing, which comprises a base structure placed just below the screen plate; and first means carried on the base structure, the first means having a contact portion which contacts a lower surface of the screen plate to scrape off any foreign things from the lower surface when the base structure is moved in a direction parallel with a major surface of the screen plate.

According to a second aspect of the present invention, there is provided a cleaning device for cleaning a screen plate used in a screen printing, which comprises a base structure which can be placed just below the screen plate; a unit detachably connected to the base structure, the unit including at least one cleaning blade whose top is pressed against a lower surface of the screen plate; a cleaning paper intimately put between the top of the cleaning blade and the lower surface of the screen plate; a cleaning paper driving mechanism for moving the cleaning paper along a given traveling path which includes the top of the cleaning blade; a solvent supplying means for feeding the cleaning paper with a solvent; and moving means for moving the base structure in a direction parallel with a major surface of the screen plate.

According to a third aspect of the present invention, there is provided a cleaning device for cleaning a screen plate used in a screen printing, which comprises a rectangular housing; a cleaning blade mounted on an upper portion of the rectangular housing, the cleaning blade being inclined with respect to the screen plate; means for defining first, second and third vertically extending slits in opposed side walls of the housing; a drive shaft rotatably received in the first slot, the drive shaft having a star-like cross section; a press roller rotatably received in the first slot and put on the drive shaft; two guide rollers rotatably received in the second and third slots respectively; and an endless cleaning paper operatively put on a top of the cleaning blade, the press roller and the two guide rollers, the endless cleaning paper having a portion intimately put between the drive shaft and the press roller.

According to a fourth aspect of the present invention, there is provided a cleaning device for cleaning a screen plate used in a screen printing, which comprises a rectangular housing; a paper feeding roller operatively installed in the housing; a paper take-up roller operatively installed in the housing at a position remote from the feeding roller; a cleaning paper extending from the feeding roller to the take-up roller; a press member installed on the housing and pressed against a lower surface of the screen plate with the cleaning paper intimately put therebetween; a base plate pivotally connected to the housing; a pneumatic cylinder mounted on the base plate; a drive roller mounted on the base plate and driven by the pneumatic cylinder; a press roller rotatably installed in the housing; and means for transmitting rotation of the press roller to the take-up roller, wherein when the base plate is pivoted to a certain work position, the drive roller is pressed against the press roller with the cleaning paper tightly put therebetween.

According to a fifth aspect of the present invention, there is provided a cleaning device for cleaning a screen plate used in a screen printing, which comprises housing; a shaft rotatably disposed in the housing, the shaft having a plurality of cleaning blades disposed thereabout; first means for rotating the shaft so that tops of the cleaning blades hit a lower surface of the screen plate; and second means for supplying the cleaning blades with a solvent.

According to a sixth aspect of the present invention, there is provided a cleaning device for cleaning a screen plate used in a screen printing, which comprises a housing; a shaft rotatably disposed in the housing, the shaft having a plurality of cleaning blades disposed thereabout; first means for rotating the shaft so that tops of the cleaning blades hit a lower surface of the screen plate; cleaning rollers rotatably disposed on the housing in a manner to be pressed against the lower surface of the screen plate; a cleaning paper intimately disposed between each of the cleaning roller and the lower surface of the screen plate; second means for moving the cleaning paper along a given traveling path which includes the outer surfaces of the cleaning rollers; and third means for feeding the cleaning paper with a solvent.

BRIEF DESCRIPTION OF THE DRAWINGS

Other objects and advantages of the present invention will become apparent from the following description when taken in conjunction with the accompanying drawings, in which:

FIG. 6A is a sketch of a cleaning blade hanging a cleaning paper put thereon, which is employed in a modification of the second embodiment;

FIG. 6B is a sketch of a cleaning blade having no cleaning paper put thereon, which is employed in another modification of the second embodiment;

FIG. 7 is a sketch of a screen cleaning device of a third embodiment of the present invention;

FIG. 8 is a sketch of the screen cleaning device of the third embodiment with other devices incorporated therewith;

FIGS. 13, 14 and 15 are sketches of a screen cleaning device of a fifth embodiment of the present invention;

DETAILED DESCRIPTION OF THE EMBODIMENTS

Figure 1:
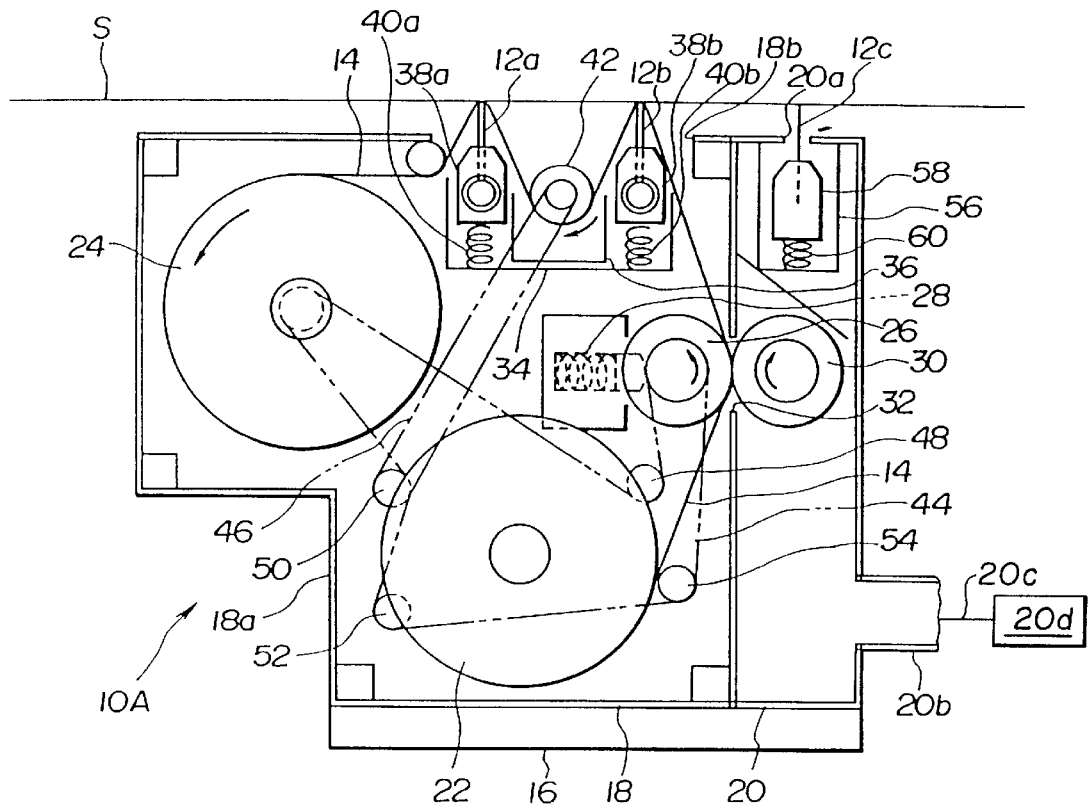
FIG. 1 is a schematic illustration of a screen cleaning device which is a first embodiment of the present invention.

Referring to FIGS. 1 to 5 of the drawings, particularly FIG. 1, there is shown a screen cleaning device 10A, which is a first embodiment of the present invention.

As is understood from FIG. 1, the device 10A is arranged below a screen plate "S" of a screen print type printer. That is, as will become apparent as the description proceeds, when, after completion of printing a given circuit pattern on an insulating base board (not shown), the base board thus printed is removed from the printing work position, the cleaning device 10A is lifted up to the illustrated working position. At this working position, first, second and third cleaning blades 12a, 12b and 12c of the cleaning device 10A are pressed at their tops against a lower surface of the screen plate "S", as shown.

The first and second blades 12a and 12b have a wet cleaning paper 14 put on the tops thereof, while the third blade 12c has no cleaning paper 14 put thereon. The cleaning device 10A is then horizontally moved forward and backward causing the tops of the cleaning blades, 12b and 12c to run forward and backward on the lower surface of the screen plate "S". More specifically, the sliding movement of the first and second cleaning blades 12a and 12b on the screen plate "S" is carried out with the wet cleaning paper 14 put therebetween. The cleaning paper 14 is automatically fed to the tops of the first and second cleaning blades 12a and 12b and automatically fed with a cleaning solvent which can dissolve an ink residue left on the screen plate "S". That is, when the cleaning action is repeated by certain times, the cleaning paper 14 on the first and second cleaning blades 12a and 12b is somewhat shifted putting a new clean part of the cleaning paper 14 onto the tops of the cleaning blades 12a and 12b and then the new clean part is fed with the cleaning solvent. Thus, during the sliding movement, the first and second cleaning blades 12a and 12b wipe away the ink residue on the screen plate "S" with an aid of the solvent, while the third cleaning blade 12c scrapes off the ink residue. As will be described hereinafter, each of the first and second cleaning blades 12a and 12b is of a double blade type which has two thin blade strips.

As is seen from FIG. 1, the cleaning device 10A comprises a rectangular base board 16. It is to be noted that the base board 16 extends in the direction perpendicular to the sheet of FIG. 1. On the base board 16, there are disposed first and second rectangular housings 18 and 20. As shown, the first rectangular housing 18 has an angularly depressed portion 18a at one lower side thereof. The first housing 18 is detachably mounted on the base board 16, while the second housing 20 is securely mounted on the base board 16. That is, when needed, the first housing 18 can be easily dismantled from the base board 16 with simple work.

Within the first housing 18, there are rotatably installed a paper feeding roller 22 and a paper take-up roller 24 whose parallel axes extend along the longitudinal axis of the first housing 18. The cleaning paper 14 is wound on the paper feeding roller 22 and fed therefrom to the take-up roller 24 in such a manner as will be described hereinafter.

Rotatably installed near the paper feeding roller 22 is a press roller 26 which is biased rightward in FIG. 1 by a spring 28. The press roller 26 is pressed against a drive roller 30 which is rotatably installed in the second housing 20, as shown. The drive roller 30 has a cylindrical outer surface covered with a rubber skin. For achieving the abutment between the press and drive rollers 26 and 30, an aperture 32 is formed in a wall of the second housing 20 as shown. The drive roller 30 is driven in the direction of the arrow by a drive mechanism (shown in FIG. 3) which will be described hereinafter.

The first housing 18 is formed at an upper wall with an elongate aperture 18b. An elongate box 34 is installed in the first housing 18 in such a manner that the interior of the box 34 is exposed to the elongate aperture 18b. It is to be noted that the box 34 is detachably connected to the first housing 18 by means of a so-called one touch connector. That is, when needed, the box 34 can be easily dismantled from the first housing 18. An elongate guide structure 36 is disposed in the elongate box 34 to define two blade holder supporting spaces (no numerals). Within the two spaces, there are slidably installed two blade holders 38a and 38b which respectively hold the first and second blades 12a and 12b. A spring 40a or 40b is disposed in each of the spaces for biasing the blade holder 38a or 38b outward, that is, upward in FIG. 1. A balance roller 42 is arranged between the two blade holders 38a and 38b.

As shown, the cleaning paper 14 drawn from the paper feeding roller 22 is intimately sandwiched between the press and drive rollers 26 and 30, and then to the top of the second cleaning blade 18b, to the balance roller 42, to the top of the first cleaning blade 12a and then to the paper take-up roller 24. It is thus to be noted that when the drive roller 30 is rotated in the direction of the arrow, the cleaning paper 14 is driven to the second cleaning blade 12b from the paper feeding roller 22. The drive roller 30 is controlled to drive the cleaning paper 14 by several millimeters for each rotation.

For driving the paper take-up roller 24 and the balance roller 42 in the directions of the respective arrows, first and second drive belts 44 and 46 are employed which are illustrated by phantom lines in the drawing. The first drive belt 44 is operatively put on a shaft of the press roller 26, a shaft of the paper take-up roller 24 and four guide rollers 48, 50, 52 and 54, while, the second drive belt 46 is operatively put on the guide roller 50 and a shaft of the balance roller 42. That is, when, due to rotation of the drive roller 30, the press roller 26 is rotated, the first and second drive belts 44 and 46 are driven to rotate the paper take-up roller 24 and the balance roller 42, which causes the cleaning paper 44 to be taken up by the take-up roller 24.

As will be described in detail hereinafter, the traveling of the cleaning paper 14 along the given path is intermittently carried out.

As shown, the second housing 20 is formed at an upper wall with an elongate aperture 20a. An elongate box 56 is installed in the second housing 20 in such a manner that the interior of the box 56 is exposed to the aperture 20a. It is to be noted that similar to the case of the above-mentioned box 34, the box 56 is detachably connected to the second housing 20. Within the box 56, there is slidably installed a blade holder 58 which holds the third cleaning blade 12c. A spring 60 is disposed in the box 56 to bias the blade holder 58 outward, that is, upward in FIG. 1. The second housing 20 is formed at a lower portion with a tube connector 20b to which a tube 20c extending from a suction pump 20d is connected. That is, under operation of the suction pump, the ink residue scraped off by the third cleaning blade 12c is instantly conveyed to the outside through the interior of the second housing 20.

Figure 2:
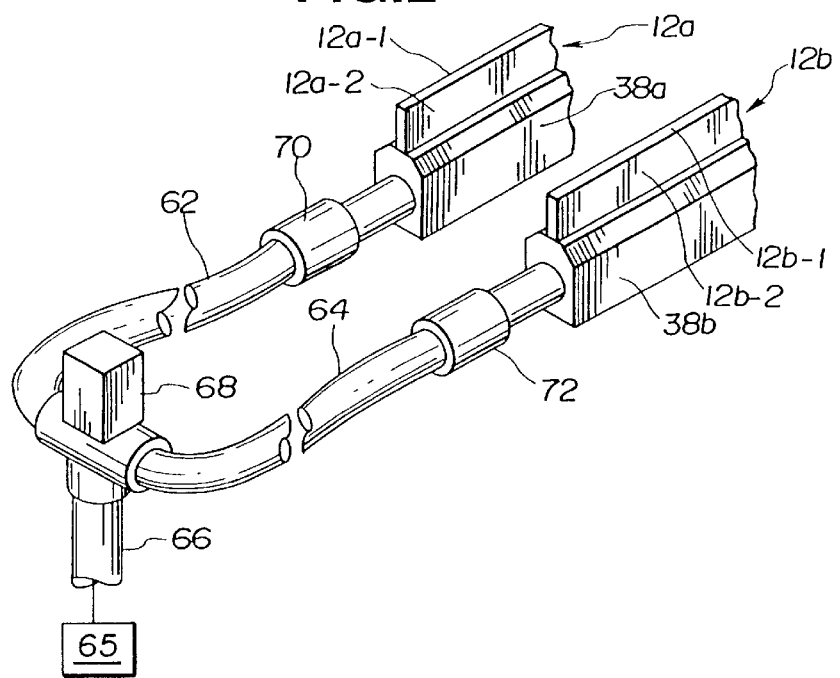
FIG. 2 is an enlarged perspective view of an essential portion of the screen cleaning device of the first embodiment.

As is seen from FIG. 2, the first and second cleaning blades 12a and 12b comprise each two thin blade strips 12a-1 and 12a-2 (or 12b-1 and 12b-2) which are arranged to leave a thin clearance therebetween.

Each thin blade strip is constructed of a steel. The thickness of the strip is about 100 to 200 $\mu$m. Preferably, the strip is projected from the blade holder 38a or 38b by about 5 to 15 mm.

The thin clearance defined between the two thin blade strips is communicated through a hollow of the blade holder 38a or 38b and a tube 62 or 64 to a solvent supplier 65. In the illustrated embodiment, the tubes 62 and 64 from the two blade holders 38a and 38b are connected to a common pipe 66 which extends to the solvent supplier 65. The common pipe 66 is equipped with an electromagnetic valve 68 for selectively opening and closing a solvent flowing passage defined therein. Denoted by numerals 70 and 72 are connectors through which the tubes 62 and 64 are detachably connected to the hollows of the blade holders 38a and 38b. Thus, when, under operation of the solvent supplier, the electromagnetic valve 68 is energized to open the solvent flowing passage, a certain amount of solvent is injected to the outside from the respective clearances of the first and second cleaning blades 12a and 12b. Thus, when such injection is carried out with the cleaning paper 14 put on the tops of the blades 12a and 12b, the cleaning paper 14 becomes wet with the solvent.

Figure 3:
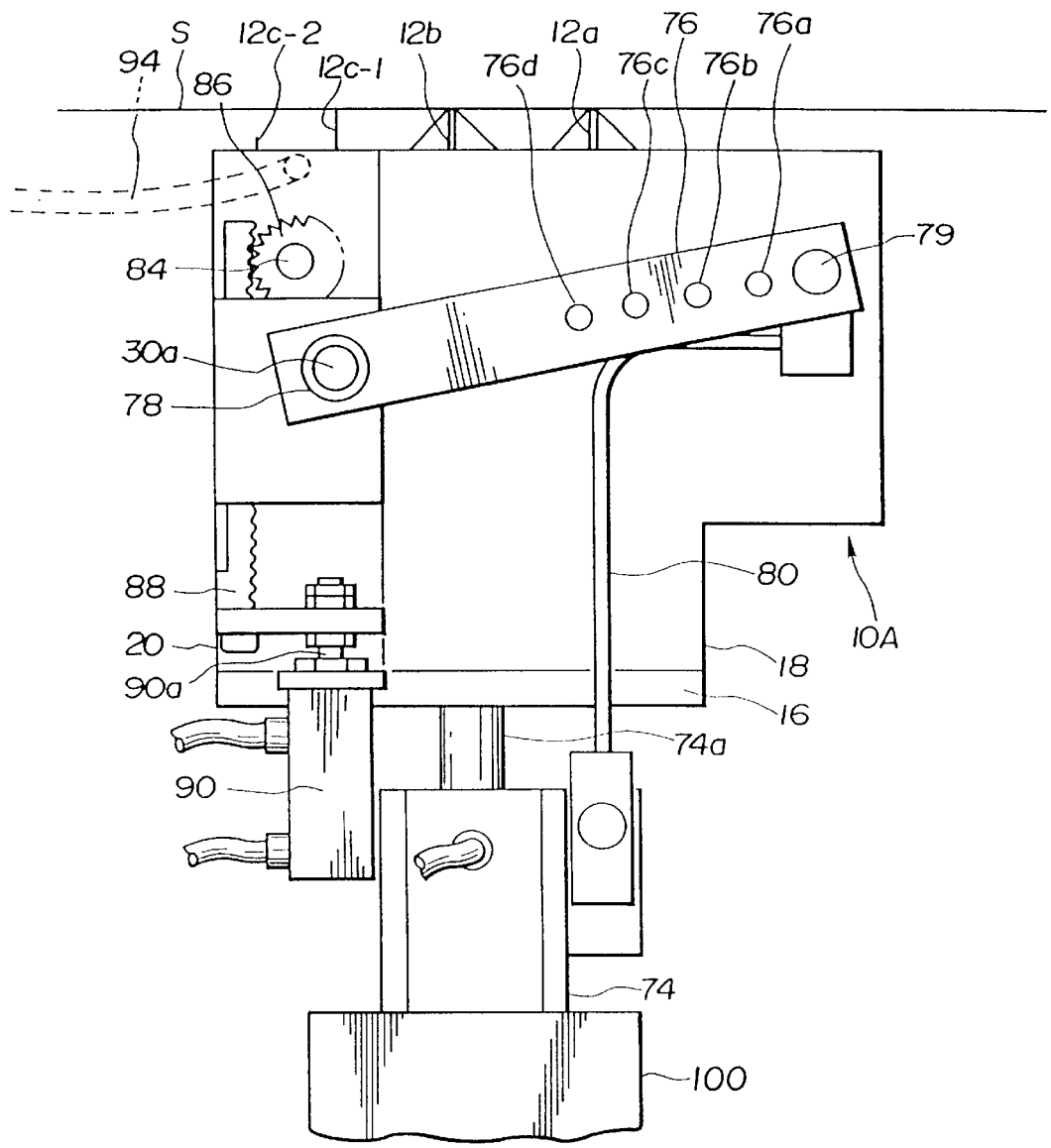
FIG. 3 is a schematic view of a drive mechanism employed in the cleaning device of the first embodiment.

Referring to FIG. 3, there is shown the drive mechanism which drives the afore-mentioned drive roller 30. It is to be noted that the illustration of FIG. 3 is taken from the back side of the illustration of the cleaning device 10A of FIG. 1.

The drive mechanism comprises a first pneumatic cylinder 74 which is mounted on a slider 100. The slider is constructed to move forward and rearward together with the cylinder 74. The cylinder 74 has a piston rod 74a whose top end is connected to the base board 16 of the cleaning device 10A. That is, when one work chamber of the cylinder 74 is charged with a compressed air, the piston rod 74a pushes up the cleaning device 10A to the above-mentioned work position (viz., the position shown in FIG. 1). A shaft of the drive roller 30 is denoted by numeral 30a. A drive lever 76 is connected at one end to the shaft 30a through a one-way clutch 78. The other end of the drive lever 76 is pivotally connected through a pin 79 to one end of an L-shaped rod 80 whose other end is pivotally connected to cylinder 74. Thus, it will be appreciated that when the piston rod 74a is projected upward, the drive lever 76 is pivoted downward (viz., in a clockwise direction in FIG. 3) about the axis of the shaft 30a of the drive roller 30. However, due to function of the one-way clutch 78, such downward pivoting of the drive lever 76 does not induce a rotation of the drive roller 30 in the paper driving direction. When, due to energization of the other work chamber of the cylinder 74, the piston rod 74a is drawn into the cylinder 74, the drive lever 76 is pivoted upward (that is, in a counterclockwise direction in FIG. 3). Due to function of the one-way clutch 78, such pivoting movement of the drive lever 76 induces a slight rotation of the drive roller 30 in the paper driving direction.

The drive lever 76 is formed with a plurality of small openings 76a to 76d with which the pin 79 is engageable. That is, by connecting the L-shaped rod 80 to one of such openings 76a to 76d through the pin 79, the rotation pitch of the drive roller 30 can be changed or controlled.

In the following, operation of the cleaning device 10A will be described with reference to FIGS. 1, 2 and 3. For ease of understanding, the description will be commenced with respect to a condition wherein the printing operation by the squeegee has just-finished. Until this time, the cleaning device 10A takes a rest condition. That is, in this rest condition, the slider on which the cleaning device 10A is mounted takes a rear rest position and the piston rod 74a of the pneumatic cylinder 74 is kept pulled down causing the cleaning device 10A to take a lower rest position.

Upon finishing of the printing operation, the base board thus printed is removed from the screen plate "S". Then, the pneumatic cylinder 74 is energized to push up the cleaning device 10A to the work position as shown in FIG. 1. As has been described hereinabove, such upward movement does not induce the paper driving rotation of the drive roller 30. Thus, the cleaning paper 14 is kept stationary. Due to the reason which will be described hereinafter, the portions of the cleaning paper 14 which have been put on the tops of the first and second cleaning blades 12a and 12b are new clean portions of the paper 14. When the cleaning device 10A comes up to the work position, the electromagnetic valve 68 is energized to open its passage for a given short time. With this, a certain amount of solvent is injected from the cleaning blades 12a and 12b to wet the cleaning paper 14 kept put on the blades. Then, the slider is energized to move forward and backward together with the cleaning device 10A mounted thereon. Thus, ink residue on the screen plate "S" is wiped off by the wet cleaning paper 14 on the first and second cleaning blades 12a and 12b and scraped off by the third cleaning blade 12c. During this one round trip of the cleaning device 10A, the suction pump connected to the interior of the second housing 20 is kept energized. Thus, the ink residue scraped off by the third cleaning blade 12c is instantly discharged to the outside through the interior of the second housing 20. When the slider comes back to the original position, the pneumatic cylinder 74 is energized to pull down the cleaning device 10A from the working position. Due to this pull down movement of the cleaning device 10A, the drive lever 76 connected to the shaft 30a of the drive roller 30 is pivoted upward. This upward pivoting of the drive lever 76 induces a slight rotation of the drive roller 30 in the paper driving direction, as has been described hereinafore. Thus, the stained portions of the cleaning paper 14 which have been put on the tops of the first and second cleaning blades 12a and 12b are replaced with new clean portions of the cleaning paper 14, and the stained portions of the paper 14 are directed toward and finally wound on the paper take-up roller 24. By adjusting the rotation pitch of the drive roller 30 and/or the distance of traveling path between the first and second cleaning blades 12a and 12b, the first cleaning blade 12a is prevented from putting thereon a stained portion of the cleaning paper 14 which has been put on the second cleaning blade 12b.

Upon completion of the above-mentioned operation, the cleaning device 10A takes the above-mentioned rest condition or stand-by position for a subsequent cleaning operation.

In the following, a modification of the above-mentioned first embodiment 10A will be described with reference to FIGS. 3 and 4. In this modification, in place of the single third cleaning blade 12c, two cleaning blades 12c-1 and 12c-2 are employed, which move like a seesaw play.

Figure 4:
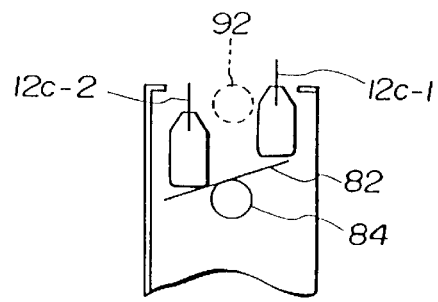
FIG. 4 is a sketch of two cleaning blades mounted on a seesaw-like plate, which are employed in a modification of the first embodiment.

That is, as is seen from FIG. 4, the two cleaning blades 12c-1 and 12c-2 are mounted on a seesaw structure. That is, these blades are mounted through blade holders (no numerals) on a pivotal plate 82 which is held on a pivot shaft 84. As is seen from FIG. 3, the pivot shaft 84 is pivotally actuated by a pneumatic mechanism. The mechanism comprises a pinion 86 secured to the pivot shaft 84, a rack 88 having the pinion 86 meshed therewith and a pneumatic cylinder 90 having a piston rod 90a connected to the rack 88. Thus, when, due to ON/OFF operation of the pneumatic cylinder 90, the rack 88 is moved downward as shown, the pinion 86 is rotated counterclockwise in FIG. 3 causing the cleaning blade 12c-1 to be projected upward. While, when the rack 88 is moved upward, the pinion 86 is rotated clockwise causing the other cleaning blade 12c-2 to be projected upward. Thus, in this modification, the cleaning blade 12c-1 or 12c-2 which abuts against the screen plate "S" can be changed in accordance with the moving direction of the slider. That is, for example, when the slider moves forward, the cleaning blade 12c-2 is raised for the cleaning purpose, while, when the slider moves back, the other cleaning blade 12c-1 is raised.

If desired, these two cleaning blades 12c-1 and 12c-2 may be supplied with a cleaning solvent. That is, in this case, as is indicated by a broken line, a solvent injection pipe 92 extends between the two cleaning blades 12c-1 and 12c-2. For supplying the solvent to the injection pipe 92, a tube 94 extending from a solvent tank (not shown) is connected to the pipe 92. The tube 94 has an electromagnetic valve operatively connected thereto, and the solvent tank is pressurized. When the valve is energized to open the tube 94, a given amount of the solvent is fed to the injection pipe 92 and thus supplied to the two cleaning blades 12c-1 and 12c-2.

Figure 5:
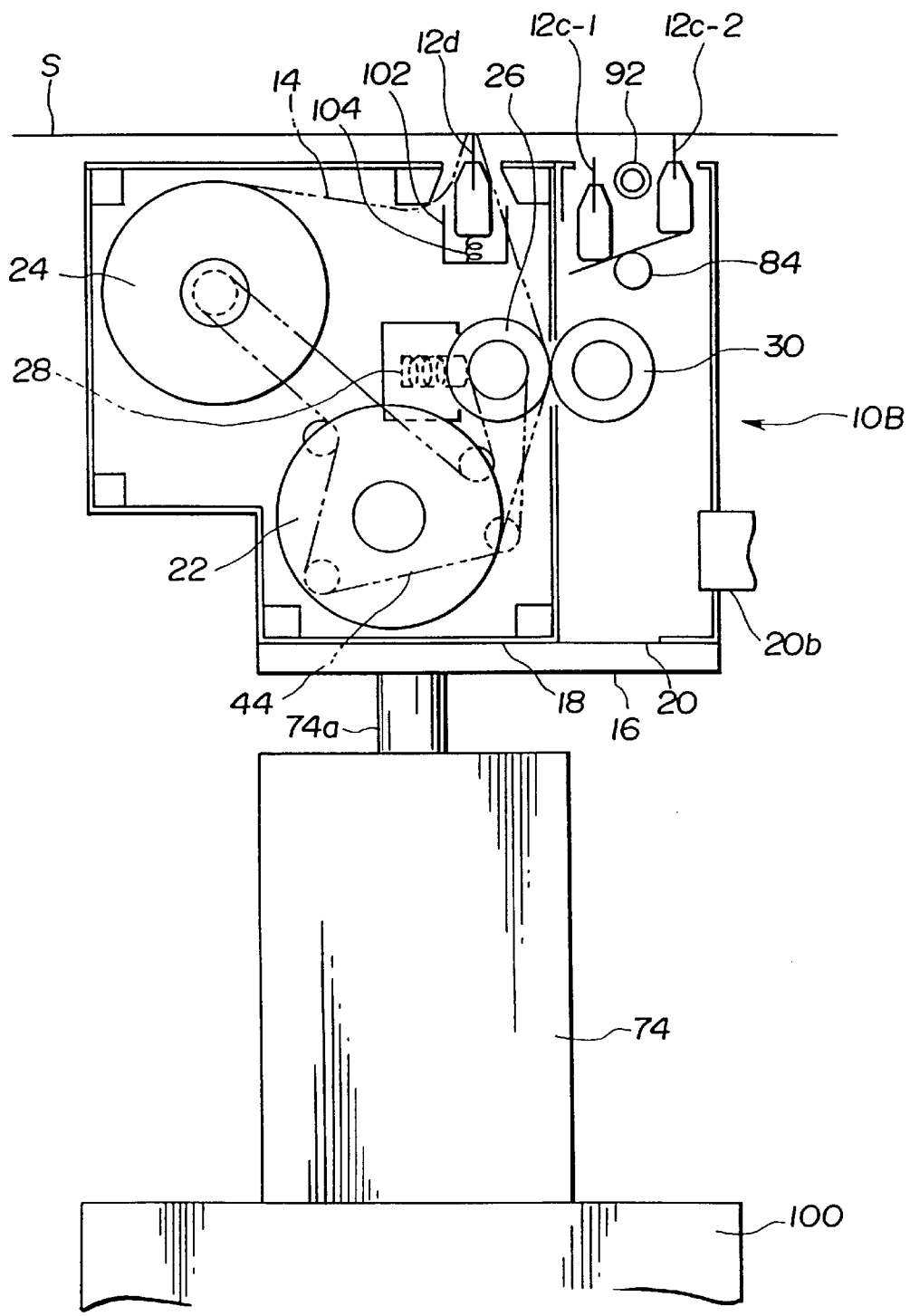
FIG. 5 is a view similar to FIG. 1, but showing a second embodiment of the present invention.

Referring to FIG. 5, there is shown a screen cleaning device 10B which is a second embodiment of the present invention.

Since the second embodiment 10B is similar in construction to the above-mentioned first embodiment 10A, only parts and construction which are different from those of the first embodiment 10A will be described in detail for ease of description. Substantially same parts and construction as those of the first embodiment 10A are denoted by the same numerals. In FIG. 5, the slider on which the pneumatic cylinder 74 is mounted is shown and designated by numeral 100.

In the second embodiment 10B, there is used only one cleaning blade 12d whose top is covered with the cleaning paper 14 and there are used two cleaning blades 12c-1 and 12c-2 whose tops are directly abut against the screen plate "S". There is employed no means which wets the cleaning paper 14 with a solvent. The cleaning blade 12d is movably held in an elongate box 102 and biased upward by a spring 104 held in the box 102. For the same reason which has been described in the first embodiment, the box 102 is detachably connected to the first housing 18, the cleaning blade 12d is of a single type. The two cleaning blades 12c-1 and 12c-2 are mounted on the above-mentioned seesaw structure. A solvent injection pipe 92 is arranged between the two blades 12c-1 and 12c-2 to feed them with a solvent.

In operation, similar movement to that of the above-mentioned first embodiment 10A is carried out by the cleaning device 10B. That is, during cleaning operation, ink residue on the screen plate "S" is wiped off by the dry cleaning paper 14 on the cleaning blade 12d and scraped off by the two cleaning blades 12c-1 and 12c-2 which have been wetted with solvent. The stained portion of the cleaning paper which has been put on the top of the cleaning blade 12d is directed toward the paper take-up roller 24 and finally wound up by the same. Ink residue scraped by the two wet cleaning blades 12c-1 and 12c-2 is instantly discharged to the outside through the interior of the second housing 20.

If desired, the following modifications may be employed in the second embodiment.

As is shown in FIG. 6A, the cleaning blade 12d may include three thin blade strips 12d-1, 12d-2 and 12d-3. In this case, the cleaning paper 14 can be pressed much stably against the screen plate "S". Furthermore, as is seen from FIG. 6B, at least one of the two cleaning blades 12d-1 or 12d-2 may includes three thin blade strips (no numerals).

Referring to FIGS. 7 and 8, there is shown a screen cleaning device 10C which is a third embodiment of the present invention.

As is understood from FIG. 7, the cleaning device 10C comprises an elongate housing 106 which has side walls 108 and 110. At a front upper portion of the housing 106, there is arranged a cleaning blade 112 which is somewhat inclined with respect to the screen plate "S" which is to be cleaned. Each side wall 108 or 110 is formed with three vertically extending slots 114, 116 and 118. Within the slots 114 of the side walls 108 and 110, there is rotatably installed a drive shaft 120 whose major portion has a star-shaped cross section as shown. At least apex portions of the drive shaft 120 are covered with a rubber material. Furthermore, within the slots 114, there is rotatably installed a press roller 121 which is placed on the drive shaft 120. Within the slots 116 and the slots 118 of the side walls 108 and 110, there are respectively and rotatably installed guide rollers 122 and 124. An endless cleaning paper 14 is put around the cleaning blade 112, the press roller 121, and the two guide rollers 122 and 124 as shown in the drawing. The cleaning paper 14 has a portion intimately put between the drive roller 120 and the press roller 121. At least one of the guide rollers 122 and 124 is kept separated from the bottom of the corresponding slot 116 or 118, so that a suitable tension is applied to the cleaning paper 14 by the weight of the guide roller.

Thus, when, due to operation of a drive mechanism which will be described hereinafter, the drive shaft 120 is rotated by a small given angle in the direction of the arrow "a", the cleaning paper 14 is slightly moved in the direction of the arrow "b", that is, the stained portion of the cleaning paper 14 which has been put on the cleaning blade 112 is replaced with a new clean portion of the paper 14.

The drive mechanism is shown in FIG. 8. The drive mechanism comprises a slider 100 which can move forward and rearward, and a pneumatic cylinder 74 which has a piston rod 74a supporting the cleaning device 10C. An exposed shaft portion of the drive roller 120 is secured to one end of a drive lever 76 through a one-way clutch. The other end of the drive lever 76 is pivotally connected to a stand 80 which is secured to the pneumatic cylinder 74. Thus, for the reason which has been described hereinafore, when the piston rod 74a is pulled down, the drive roller 120 is rotated by a small given angle in the paper driving direction.

Figure 9:
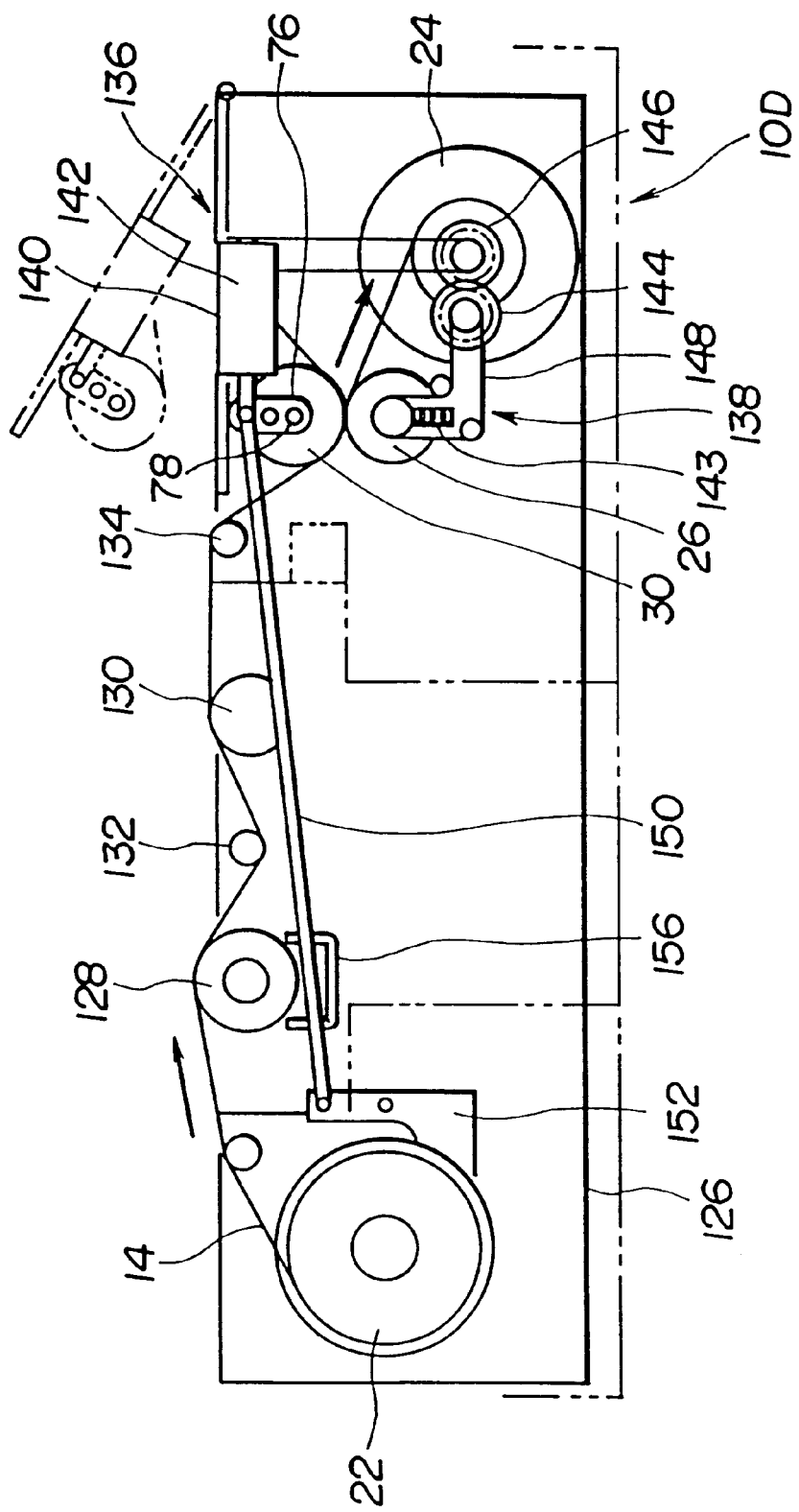
FIG. 9 is a sketch of a screen cleaning device of a fourth embodiment of the present invention.

Referring to FIG. 9, there is shown a screen cleaning device 10D which is a fourth embodiment of the present invention.

The cleaning device 10D comprises a rectangular housing 126. Within the housing 126, there are rotatably installed a paper feeding roller 22 and a paper take-up roller 24 which are spaced from each other as shown. A cleaning roller 128 is arranged near the feeding roller 22, and larger and smaller guide rollers 130, 132 and 134 are rotatably arranged between the cleaning roller 128 and the take-up roller 24. As shown, the cleaning paper 14 fed from the feeding roller 22 is put on an upper surface of the cleaning roller 128, put on a lower surface of the smaller guide roller 132, put on an upper surface of the larger guide roller 134 and then led toward the paper take-up roller 24 through a paper driver mechanism which will be described in the following.

The paper drive mechanism comprises first and second units 136 and 138 which are incorporated to drive the cleaning paper 14 toward the paper take-up roller 24.

The first unit 136 comprises a base plate 140 pivotally connected to the housing 126. A pneumatic cylinder 142 is disposed on the base plate 140, which has a piston rod (no numeral). A drive roller 30 is rotatably mounted on the base plate 140. The piston rod of the pneumatic cylinder 142 is pivotally connected to one end of a drive lever 76 whose other end is connected to a shaft of the drive roller 30 through a one-way clutch 78. Thus, when the piston rod is projected from or drawn into the cylinder 142, the pivot motion of the drive lever 76 induces a rotation of the drive roller 30 in the paper driving direction by a small given angle. When in use, the drive roller 30 takes a work position as shown in a solid line. While, when not in use, the base plate 140 can pivot upward placing the drive roller 30 at a rest position as shown in a phantom line.

The second unit 138 comprises a press roller 26 which is rotatably arranged near the paper take-up roller 24 and biased upward by a spring 143, as shown. A gear 144 meshed with a gear 146 formed on the take-up roller 24 is connected to the press roller 26 through an endless drive belt 118. Two smaller guide rollers (no numerals) are used for guiding the drive belt 148. Thus, when the press roller 26 is rotated in a given direction, the paper take-up roller 24 is rotated in the paper winding direction.

Designated by numeral 150 is a breaking rod whose one end has a brake shoe 152 operatively engaged with the feeding roller 22. The other end of the braking rod 150 is pivotally connected to the piston rod of the pneumatic cylinder 142.

When in use, the first unit 136 takes the illustrated work position pressing the drive roller 30 against the press roller 26 with the cleaning paper 14 intimately put therebetween.

In the following, operation of the cleaning device 10D will be briefly described. Although not shown in the drawing, two means corresponding to the slider 100 (see FIG. 5) and the pneumatic cylinder 74 (see FIG. 5) are also employed in this fourth embodiment. That is, until completion of printing operation by the squeegee, the cleaning device 10D takes its lower rest position.

Upon finishing of the printing operation, the cleaning device 10D is lifted up to the work position. During this, the pneumatic cylinder 142 of the first unit 136 is energized to rotate the drive roller 30 by a certain angle, which drives a certain length of the cleaning paper 14 toward the take-up roller 24. The rotation of the drive roller 30 rotates the press roller 26 and thus rotates the take-up roller 24 in the paper winding direction. Thus, the certain length of the cleaning paper 14 is taken up by the take-up roller 24. The movement of the cleaning paper 14 replaces a stained portion of the paper 14 on the cleaning roller 128 with a new clean portion.

When the cleaning device 10D comes to the work position, the slider moves forward and backward pressing the cleaning roller 128 against the screen plate "S" with the cleaning paper 14 put therebetween. Thus, screen plate "S" is cleaned by the cleaning device 10D.

Upon completion of the above-mentioned operation, the cleaning device 10D comes to the above-mentioned rest position or stand-by position for a subsequent cleaning operation.

Figure 11:
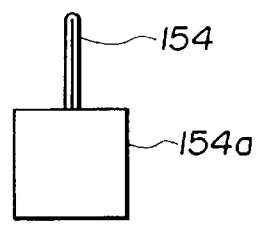
FIG. 11 is a sketch of a cleaning blade which is employable in the fourth embodiment.

In the following, a modification of the fourth embodiment 10D will be described with reference to FIGS. 9 and 11.

That is, in this modification, a cleaning blade 154 of FIG. 9 is used in place of the cleaning roller 128. The cleaning blade 154 is held by a blade holder 154a. As is shown in FIG. 9, for holding the blade holder 154a, a box 156 is detachably installed in the housing 126.

FIGS. 10A, 10B, 12A and 12B show the manner in which the cleaning paper 14 on the cleaning roller 128 or the cleaning blade 154 treats the ink residue on the screen plate "S".

Figure 10A:
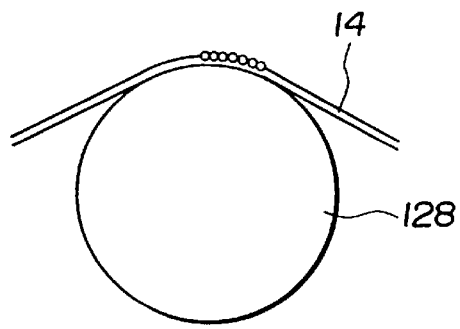
FIGS. 10A and 10B are sketches of a cleaning roller employed in the fourth embodiment, showing different cleaning papers put thereon.
Figure 10B:
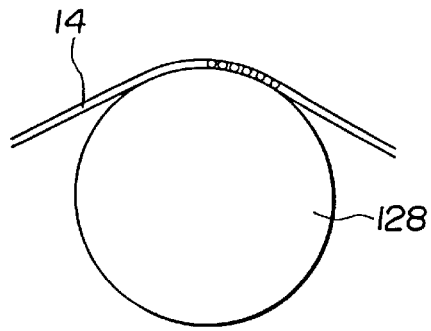
Figure 12A:
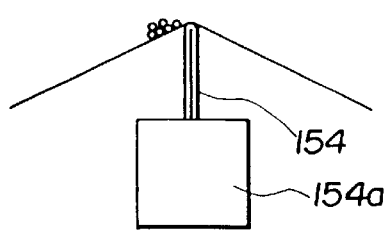
FIGS. 12A and 12B are sketches of the cleaning blade, showing different cleaning papers put thereon.
Figure 12B:
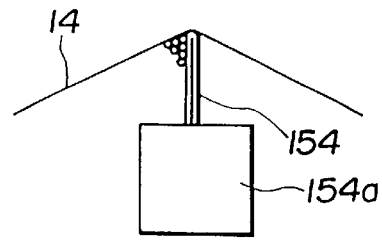

In cases of FIGS. 10A and 12A, a conventional cleaning paper 14 is used, while, in cases of FIGS. 10B and 12B, an improved blotting paper 14 is used. As shown, when the improved blotting paper 14 is used, the ink residue is effectively collected by the paper.

Figure 13:
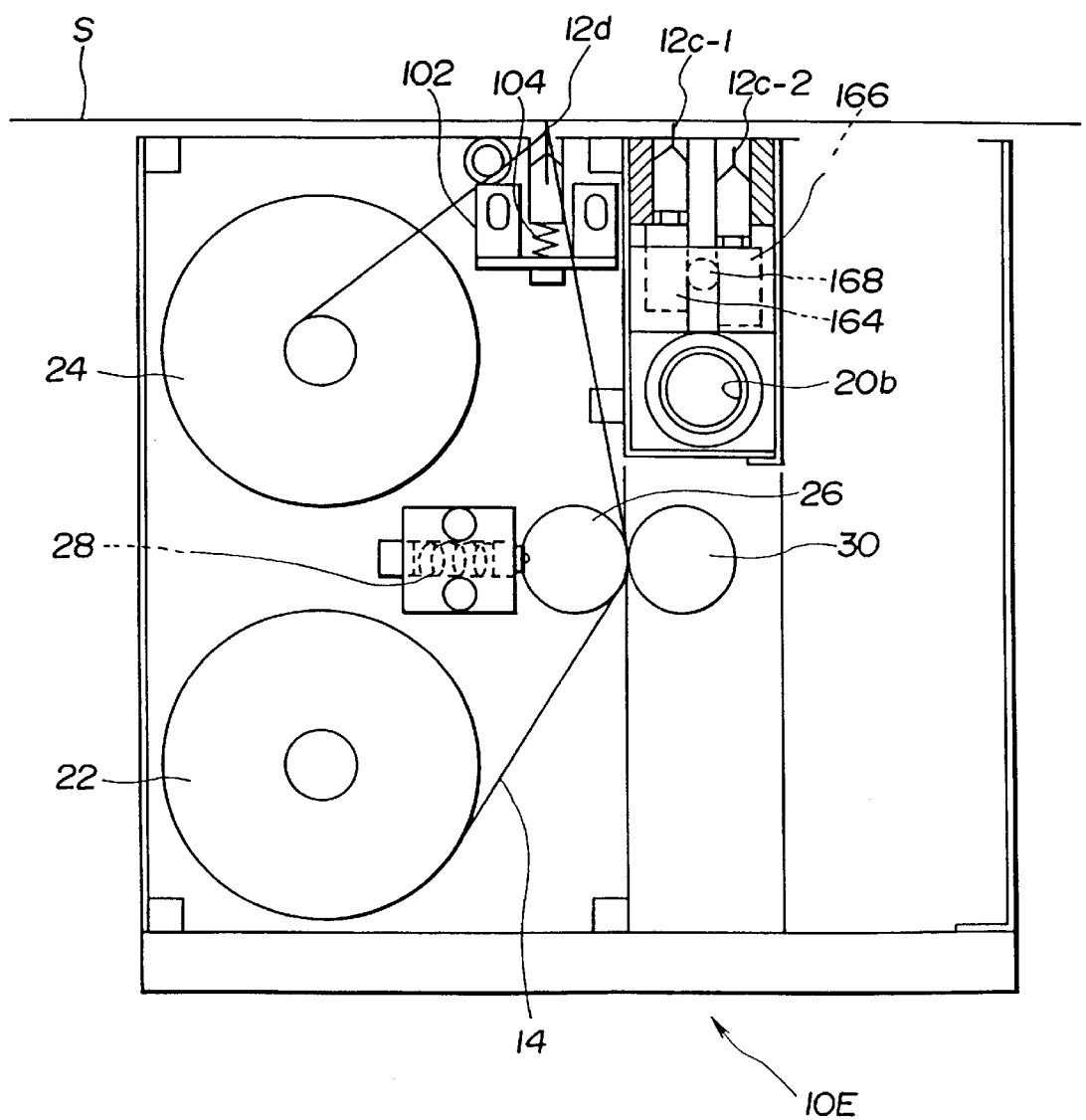

Referring to FIGS. 13 to 15, there is shown a screen cleaning device 10E which is a fifth embodiment of the present invention.

Since this fifth embodiment 10E is similar in construction to the above-mentioned second embodiment 10B, only parts and construction which are different from those of the second embodiment 10B will be described in detail for ease of description. Substantially same parts and construction as those of the second embodiment 10B are denoted by the same numerals.

In this fifth embodiment 10E, the power transmission from the drive roller 30 to the take-up roller 24 is effected through gears and a belt, and the seesaw-like movement of the two cleaning blades 12c-1 and 12c-2 is effected by using racks and a pinion, which will be described in the following.

That is, as is seen from FIG. 14, the press roller 26 driven by the drive roller 30 is formed with a gear 26a. A gear 158 is meshed with the gear 26a and meshed with another gear 160. The gear 160 is formed with a pulley 160a. An endless belt 162 is put on the pulley 160a and the shaft of the take-up shaft 24. Thus, when, due to rotation of the drive roller 30, the press roller 26 is rotated in a given direction, the take-up roller 24 is rotated in the paper winding direction.

As is seen from FIG. 13, the two cleaning blades 12c-1 and 12c-2 are equipped with respective racks 164 and 166 between which a smaller pinion 168 is operatively disposed. As is seen from FIG. 15, the smaller pinion 168 is driven by a larger pinion 86 which is operatively meshed with a rack 88. The rack 88 is driven by a piston rod 90a of a pneumatic cylinder 90. Thus, when the piston rod 90a is pushed up or pulled down, the smaller pinion 168 is rotated inducing the seesaw like movement of the two cleaning blades 12c-1 and 12c-2.

Although not shown in FIG. 13, a solvent supplying means corresponding to the solvent injection pipe 92 of the second embodiment (see FIG. 5) is incorporated with the two cleaning blades 12c-1 and 12c-2.

Figure 16:
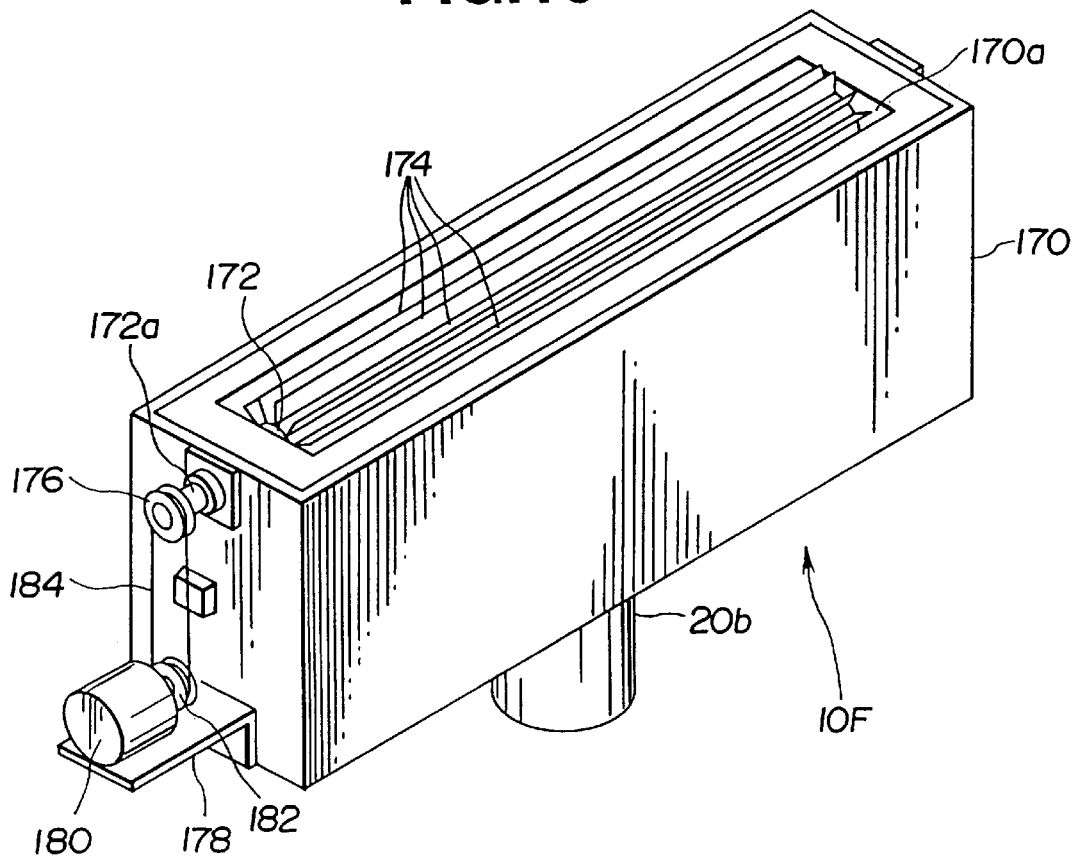
FIG. 16 is a perspective view of a screen cleaning device of a sixth embodiment of the present invention.
Figure 17:
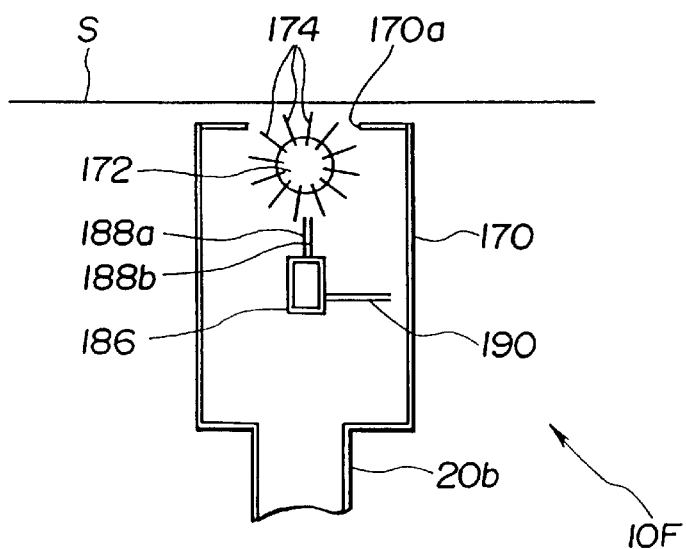
FIG. 17 is a schematically illustrated sectional view of the cleaning device of the sixth embodiment.

Referring to FIGS. 16 and 17, there is shown a screen cleaning device 10F which is a sixth embodiment of the present invention.

The cleaning device 10F comprises a rectangular housing 170 which is formed at its upper wall with a rectangular opening 170a. Within the housing 170, there is installed a shaft 172 whose axial ends are rotatably supported by longitudinally opposed walls of the housing 170. A plurality of cleaning blades 174 are disposed around the shaft 172 at evenly spaced intervals.

As shown in FIG. 17, the cleaning blades 174 are projected from the opening 170a of the housing 170 when brought to their upper positions.

As shown in FIG. 16, one axial end of the shaft 172 has an extended portion 172a exposed to the outside from the longitudinal wall of the housing 170. A pulley 176 is coaxially secured to the extended portion 172a to rotate therewith. A holder plate 178 is secured to the longitudinal wall of the housing 170 to mount thereon an electric motor 180. An output shaft (no numeral) of the motor 180 is equipped with a pulley 182. An endless belt 184 is operatively put on the two pulleys 182 and 176. Thus, when the electric motor 180 is energized, the blade-mounted shaft 172 is rotated at a given speed.

As shown in FIG. 17, within the housing 170, there is installed a pipe 186 of rectangular cross section below the blade-mounted shaft 172. Two resiliently deformable strips 188a and 188b are mounted on the pipe 186 in such a manner that a thin clearance defined between the strips 188a and 188b is communicated with the interior of the pipe 186. As shown, the two strips 188a and 188b have tops contactable with the cleaning blades 172 of the shaft 172. A tube 190 extending from a solvent supplier (not shown) is connected to the pipe 186 to feed the interior of the pipe 186 with a solvent. Designated by numeral 20b is a tube connector to which a tube (not shown) extending from a suction pump is connected.

In the following, operation of the cleaning device 10F will be described. Although not shown in the drawings, two means corresponding to the slider 100 (see FIG. 5) and the pneumatic cylinder 74 (see FIG. 5) are also employed in this sixth embodiment.

When the cleaning device 10F is lifted up to the work position as is seen from FIG. 17, the suction pump is energized and the electric motor 180 is energized to run the blade-mounted shaft 172. At the same time, the solvent supplier is energized to inject solvent from the clearance of the strips 188a and 188b. Thus, the cleaning blades 174 scrape off ink residue left on the screen plate "S" at high speed. During rotation of the blade-mounted shaft 172, the cleaning blades 174 hit the strips 188a and 188b, and thus, any ink residue having been left on the cleaning blades 174 is scattered into the interior of the housing 170. Separation of the ink residue from the cleaning blades 174 is promoted by the solvent supplied thereto from the clearance of the strips 188a and 188b. The ink residue is then discharged to the outside of the housing 170 due to the work of the suction pump.

In desired, the following modification may be employed in this sixth embodiment 10F.

That is, in the modification, a cleaning paper driven by a suitable drive mechanism is put on the tops of the strips 188a and 188b.

Referring to FIGS. 18A, 18B, 21, 22 and 23, there is shown a screen cleaning device 10G which is a seventh embodiment of the present invention.

Figure 18A:
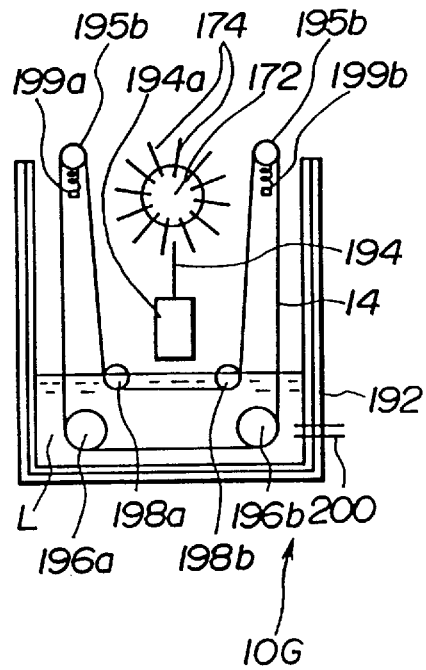
FIGS. 18A and 18B are sketches of a screen cleaning device of a seventh embodiment of the present invention.
Figure 22:
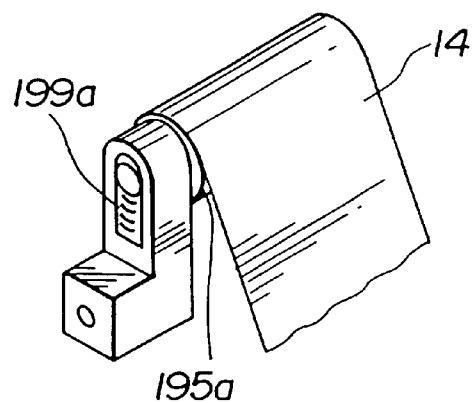
FIG. 22 is an enlarged perspective of one cleaning roller employed in the seventh embodiment.

As is well understood from FIG. 18A, the cleaning device 10G comprises a container 192. In an upper portion of the container 192, there is rotatably disposed a blade-mounted shaft 172. A resiliently deformable strip 194 held by a blade holder 194a is installed in the container 192 below the shaft 172. Two cleaning rollers 195a and 195b are arranged at the upper portion of the container 192, each cleaning roller 195a or 195b being biased upward by springs 199a and 199b in such a manner as is shown in FIG. 22. Two larger guide rollers 196a and 196b (see FIG. 18A) and two smaller guide rollers 198a and 198b are rotatably disposed in a lower portion of the interior of the container 192, as shown. An endless cleaning paper 14 is put on these six rollers in the illustrated manner. A cleaning solvent "L" is contained in the container 192 to wet the cleaning paper 14. A tube 200 extending from a solvent supplier (not shown) is connected to a lower portion of the container 192.

Figure 18B:
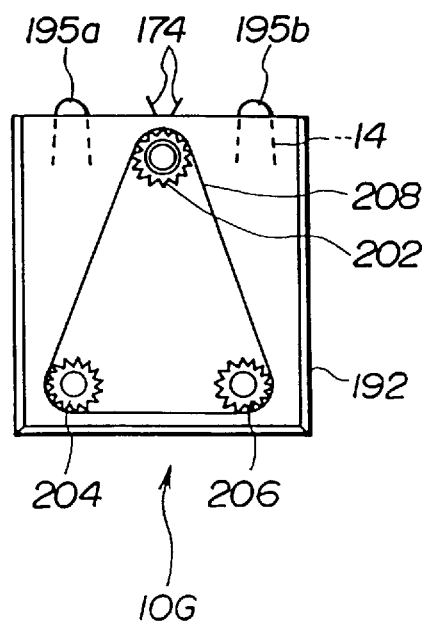

As is seen from FIG. 18B, the blade-mounted shaft 172 and the two larger guide rollers 196a and 196b have extended portions exposed to the outside of the container 192. The extended portions have respective gears or pulleys 202, 204 and 206 secured thereto. An endless toothed belt 208 is put on these three gears 202, 204 and 206 in the illustrated manner. Thus, when, for example, the gear 202 is rotated, blade-mounted shaft 172 is rotated and the cleaning paper 14 is driven in a certain direction with the solvent absorbed therein.

Figure 21:
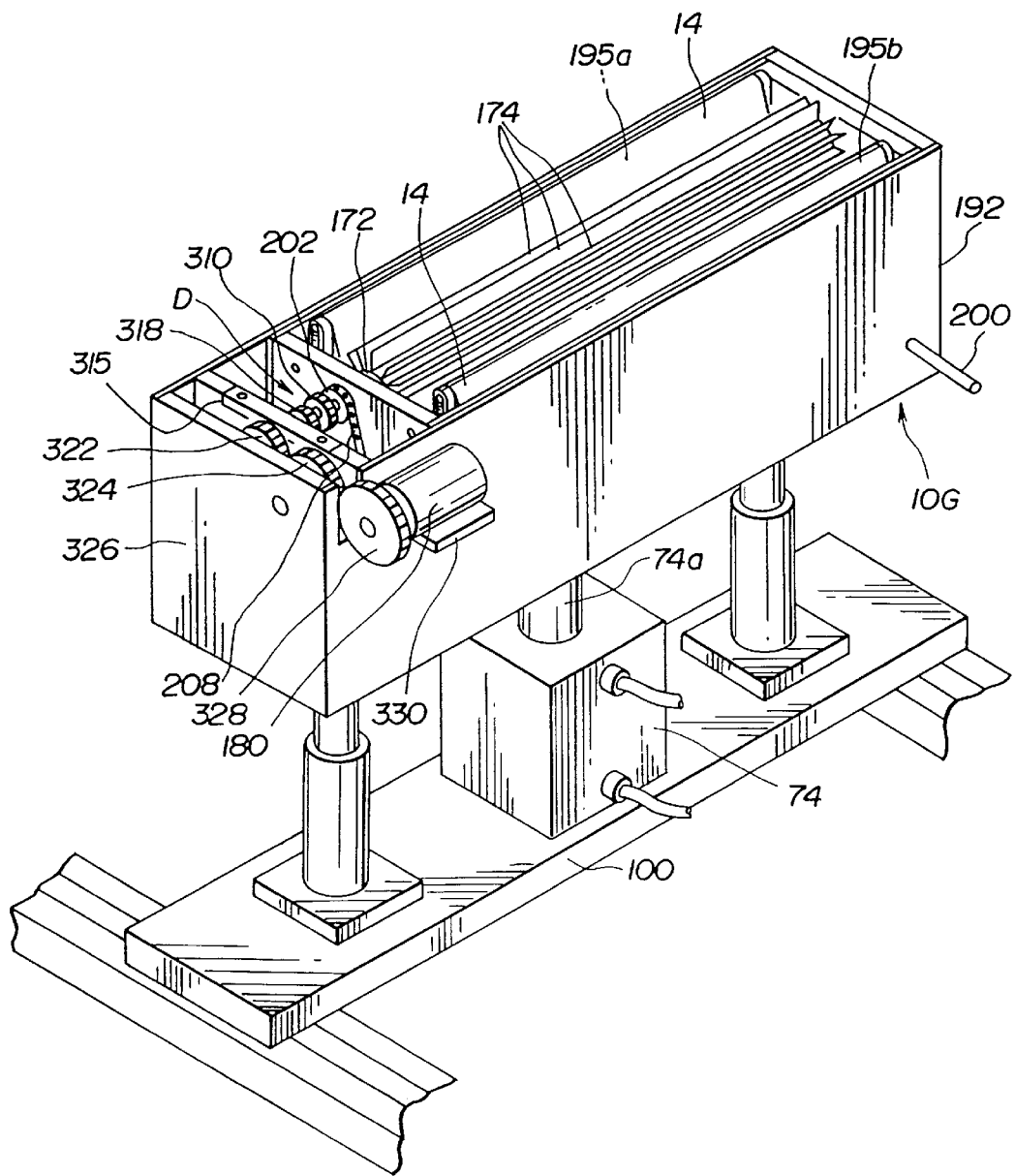
FIG. 21 is a perspective view of the screen cleaning device of the seventh embodiment of FIGS. 18A and 18B.
Figure 23:
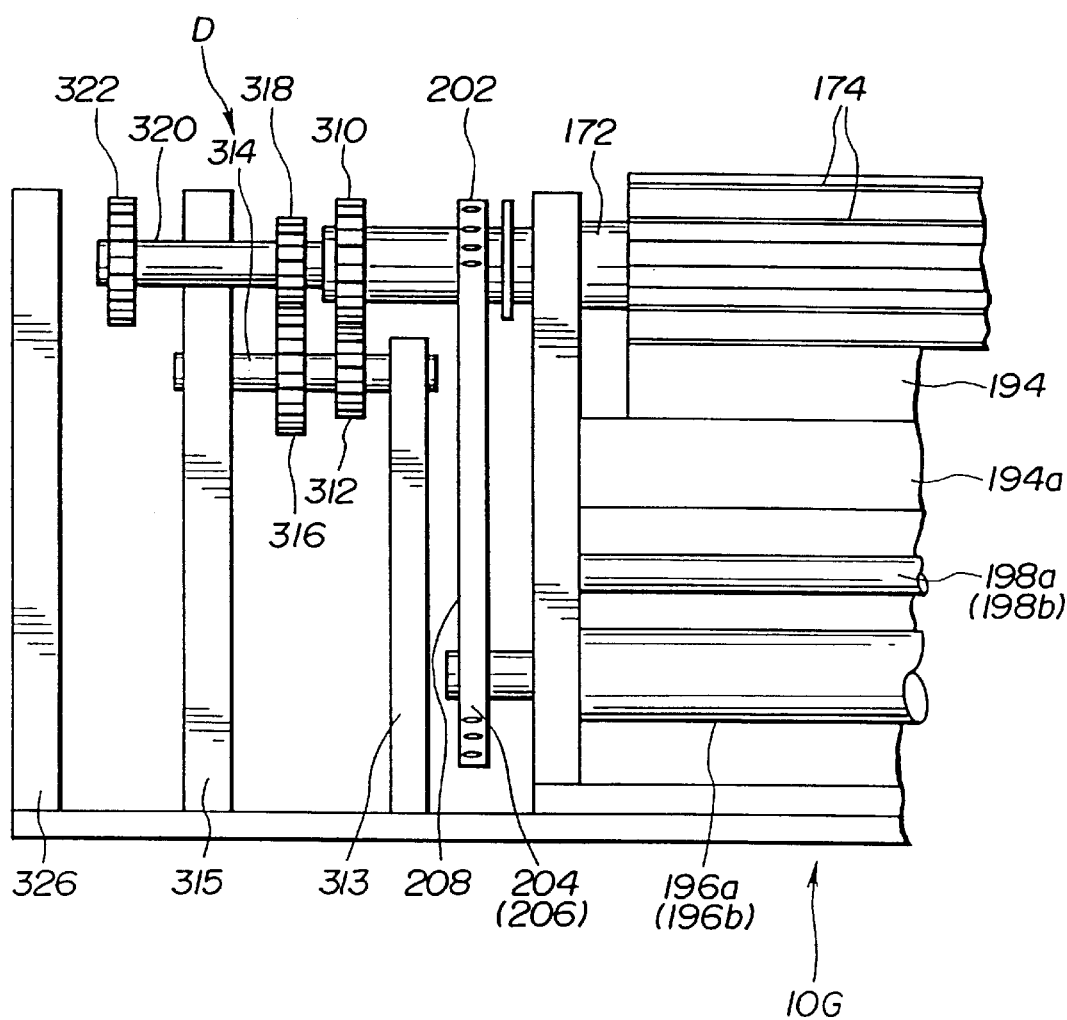
FIG. 23 is an enlarged side view of a drive mechanism employed in the seventh embodiment.

As is seen from FIGS. 21 and 23, the extended portion on which the gear 202 is disposed is driven by a drive mechanism "D" powered by an electric motor 180.

As is best seen from FIG. 23, the drive mechanism "D" comprises a first gear 310 disposed on the extended portion of the blade-mounted shaft 172. A second gear 312 disposed on a first shaft 314 is meshed with the first gear 310. The first shaft 314 is rotatably supported by supporting walls 313 and 315. A third gear 316 disposed on the first shaft 314 is meshed with a fourth gear 318 which is disposed on a second shaft 320. The second shaft 320 is rotatably disposed by the supporting wall 315 and has a fifth gear 322 disposed thereon.

As is seen from FIG. 21, the fifth gear 322 is meshed with a sixth gear 324 rotatably supported by the walls 315 and 326. The sixth gear 324 is meshed with a seventh gear 328 which is disposed on an output shaft of the electric motor 180. The motor 180 is mounted on a support plate 330 secured to the container 192. Thus, when the electric motor 180 is energized, the power produced by the motor 180 is transmitted to the gear 202 of the blade-mounted shaft 172 through a gear train of the above-mentioned gears.

Figure 19:
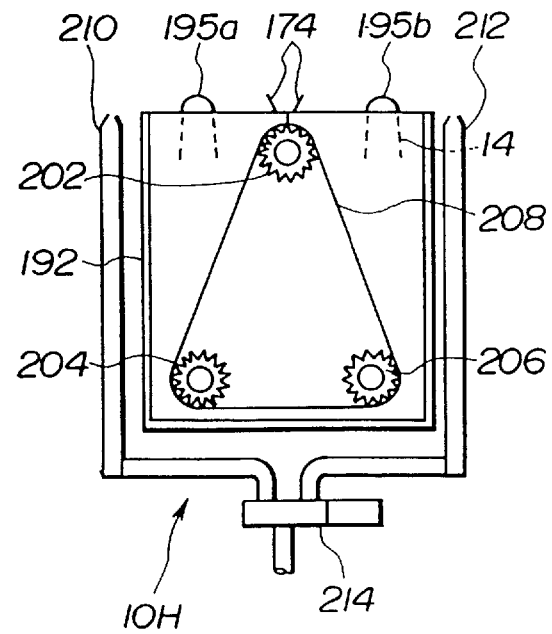
FIG. 19 is a view similar to FIG. 18B, but showing an eighth embodiment of the present invention.

Referring to FIG. 19, there is shown a screen cleaning device 10H of an eighth embodiment of the present invention.

Since this embodiment 10H is similar in construction to the above-mentioned seventh embodiment 10G, only different portions will be described in the following.

That is, in this embodiment 10H, in place of the solvent "L" contained in the container 192 which is adapted in the seventh embodiment 10G, two solvent injection nozzles 210 and 212 are employed, which are arranged at front and rear positions of the container 192 to inject cleaning solvent to the lower surface of the screen plate "S". These nozzles 210 and 212 are connected to a solvent supplier (not sown) through an electromagnetic valve 214. Thus, when the valve 214 is energized to open its passage, a suitable amount of solvent is injected to the screen plate "S" from the nozzles 210 and 212.

Figure 20:
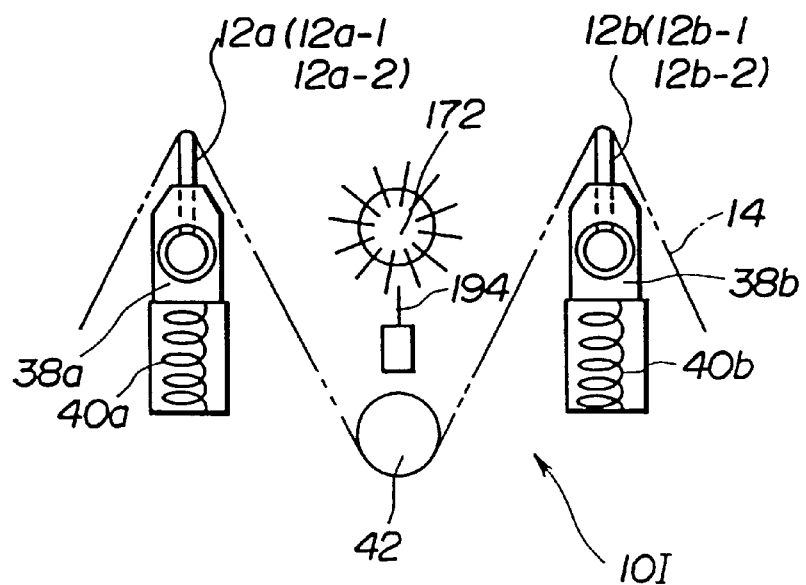
FIG. 20 is a sketch showing an essential portion of a screen cleaning device of a ninth embodiment of the present invention.

Referring to FIG. 20, there is shown a screen cleaning device 10I of a ninth embodiment of the present invention, which is a modification of the above-mentioned seventh embodiment 10G (see FIG. 18A).

In this modification 10I, two cleaning blades 12a and 12b are employed in place of the cleaning rollers 195a and 195b of the seventh embodiment LOG. Each cleaning blade 12a or 12b includes two thin blade strips 12a-1 and 12a-2 (or 12b-1 and 12b-2) between which a thin clearance is defined, like in case of the afore-mentioned first embodiment 10A (see FIG. 2). The cleaning blades 12a and 12b are held by respective blade holders 38a and 38b which are biased upward by respective springs 40a and 40b. A balance roller 42 is arranged between the two cleaning blades 12a and 12b. The thin clearance defined by each cleaning blade 12a or 12b is communicated through a hollow of the blade holder 38a or 38b to a solvent supplier (not shown). The cleaning paper 14 is put on the two cleaning blades 12a and 12b and the balance roller 42 in the illustrated manner.

Referring to FIGS. 24 to 30, there is shown a cleaning device 10J of a tenth embodiment of the present invention.

Since this embodiment 10J is similar in construction to the above-mentioned fifth embodiment 10E of FIG. 13, only parts and construction which are different from those of the fifth embodiment 10E will be described in detail in the following for ease of description. Substantially same parts and construction as those of the fifth embodiment 10E are denoted by the same numerals.

Figure 24:
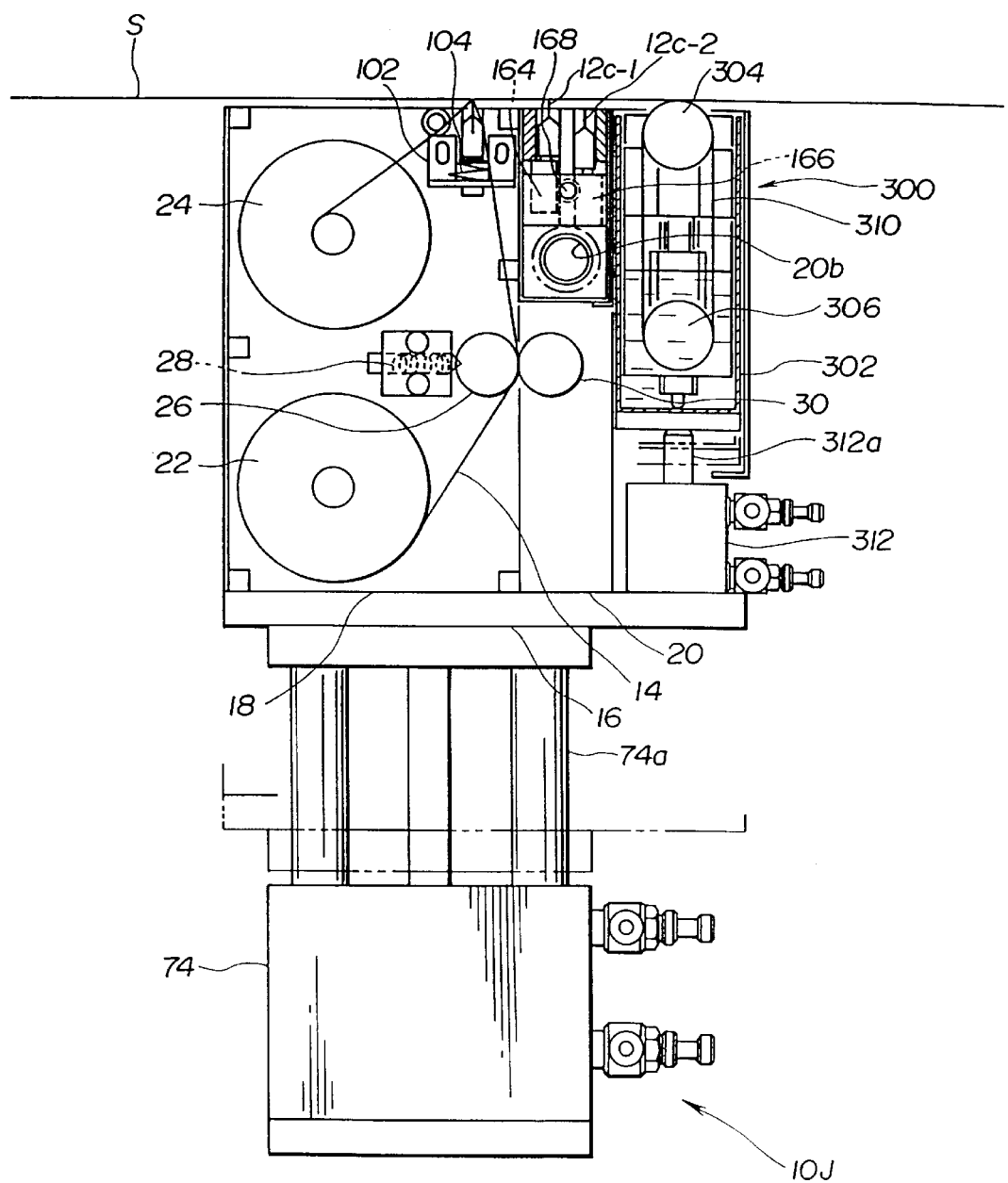
FIG. 24 is a view similar to FIG. 13, but showing a screen cleaning device of a tenth embodiment of the present invention.

As is understood from FIG. 24, in this tenth embodiment 10J, in addition to all elements of the cleaning device 10E of the fifth embodiment, there is further employed a roller type cleaning mechanism 300 which is arranged on the base board 16 beside the second housing 20.

Figure 25:
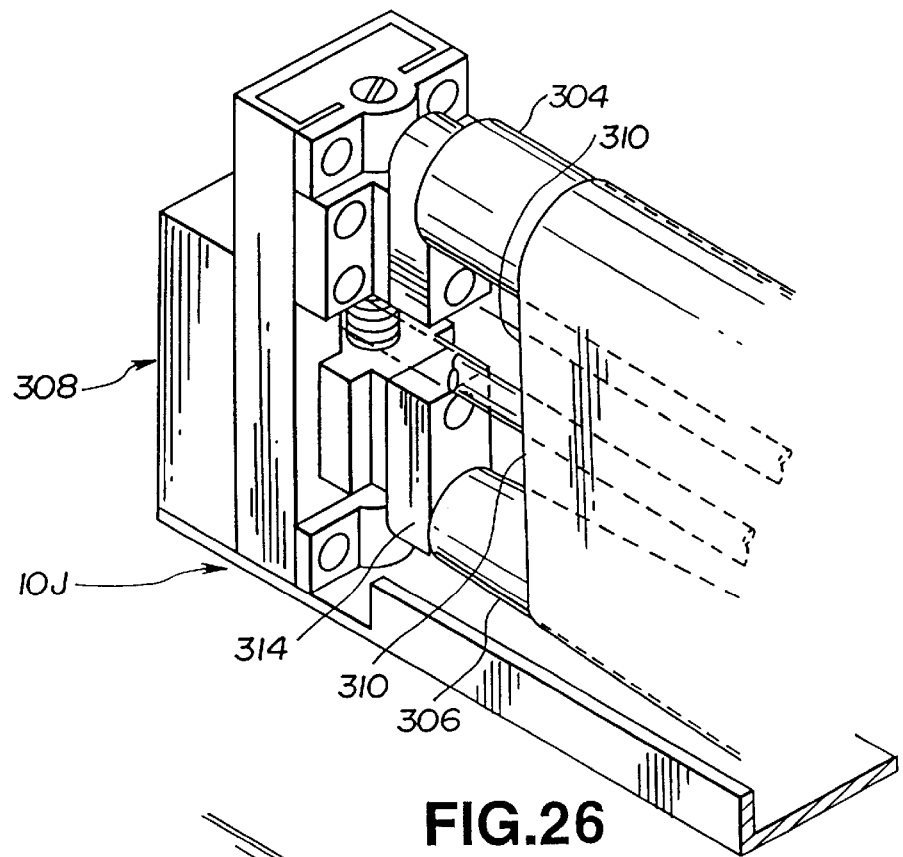
FIG. 25 is a perspective view of a part of the tenth embodiment where upper and lower rollers are arranged.

The roller type cleaning mechanism 300 comprises a rectangular container 302 in which a given amount of cleaning solvent is contained. Within the container 302, there are installed upper and lower rollers 304 and 306 which are rotatably held by a holding structure 308 as is shown in FIG. 25. A looped cleaning paper 310 is put around the upper and lower rollers 304 and 306. It is thus to be noted that when the upper roller 304 is rotated, the lower roller 306 is also rotated due to the work of the looped cleaning paper arranged therebetween. The lower roller 306 is put in the solvent as shown in FIG. 1.

A pneumatic cylinder 312 is interposed between the base board 16 and the container 302. That is, a piston rod 312a of the cylinder 312 puts thereon the container 302. Thus, upon energization of the pneumatic cylinder 312, the container 302 is moved up to the illustrated working position where the upper roller 304 is pressed against the lower surface of the screen plate "S" with the cleaning paper 310 intimately put therebetween or moved down a lower position where the upper roller 304 is separated from the screen plate "S".

FIG. 25 shows the detail of the upper and lower rollers 304 and 306. As shown by this drawing, the lower roller 306 is barrel-shaped, while, the upper roller 304 is cylindrical.

Figure 26:
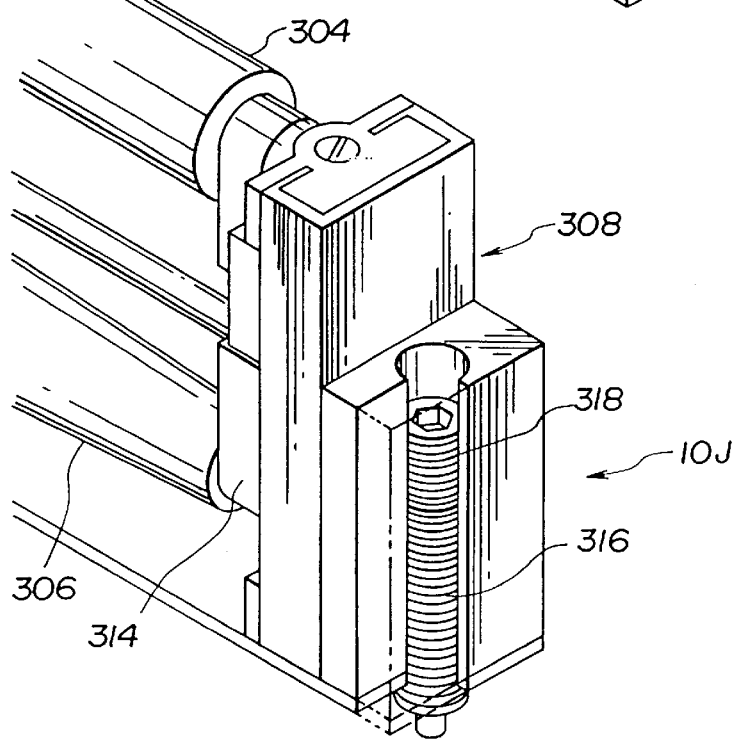
FIG. 26 is a partially cut perspective view of a part of the tenth embodiment where a mechanism for adjusting the distance between the upper and lower rollers is arranged.

FIG. 26 shows a mechanism for adjusting the distance between the upper and lower rollers 304 and 306. The mechanism comprises a holder 314 by which the lower roller 306 is rotatably held. The holder 314 is vertically moved upward or downward when a bolt 316 is turned clockwise or counterclockwise in a threaded hole (no numeral) formed in a projected part 308a of the holding structure 308. Designated by numeral 318 is a stopper bolt screwed in the threaded hole for fixing the bolt 316.

Figure 27:
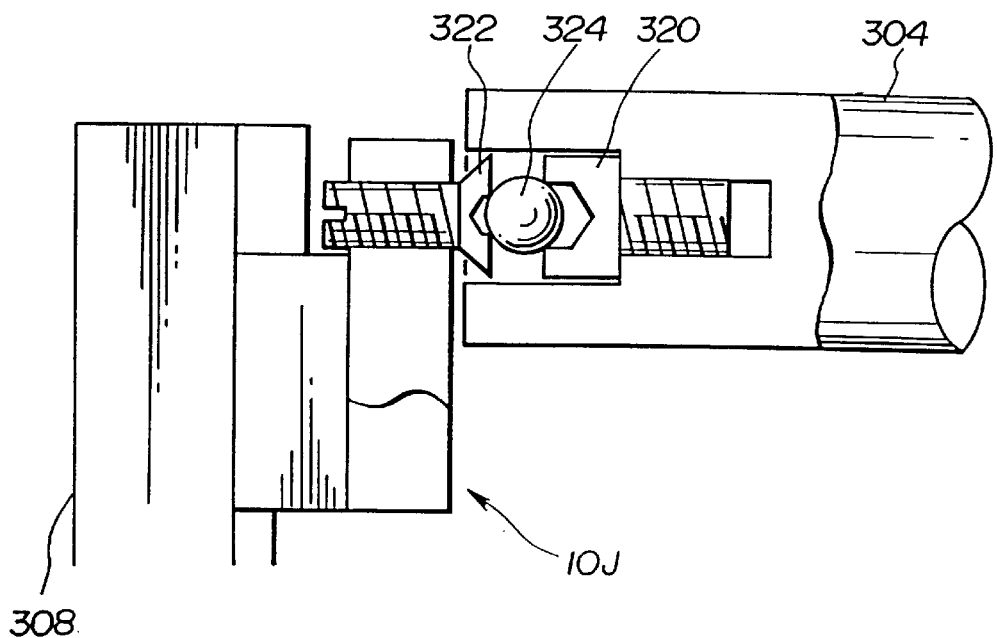
FIG. 27 is a sectional view of a part of the tenth embodiment where a ball bearing associated with the upper roller is arranged.
Figure 28:
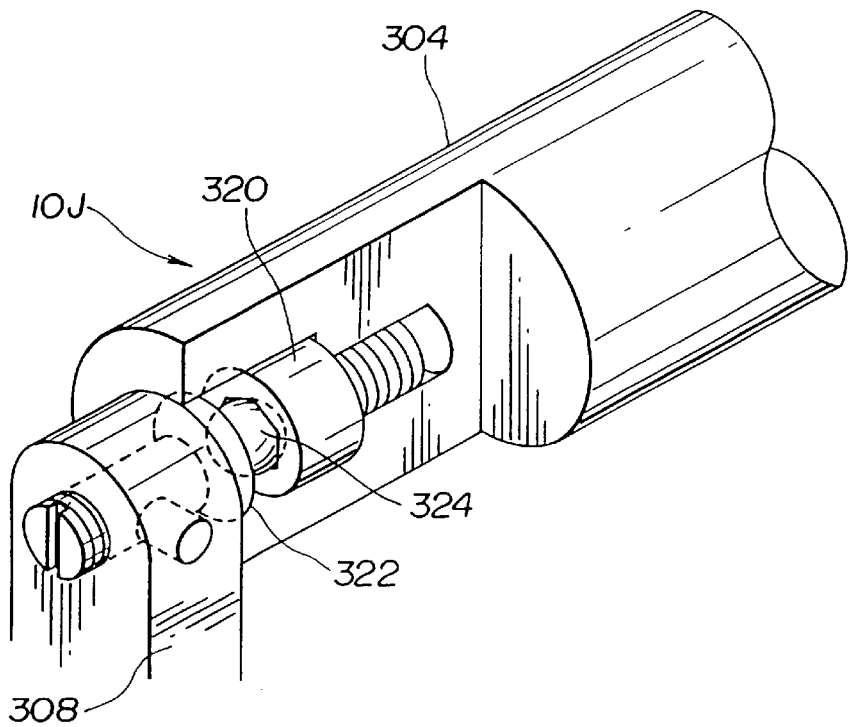
FIG. 28 is a partially cut perspective view of the part where the ball bearing is arranged.

FIGS. 27 and 28 show a bearing mechanism for rotatably supporting the upper roller 304 (or lower roller 306). As shown, the bearing mechanism comprises a first seat 320 tightly held in a bore of the upper roller 304, a second seat 322 tightly held by the holding structure 308 and a ball bearing 324 intimately put between the first and second seats 320 and 322. As shown in FIG. 28, the first and second seats 320 and 322 have each a threaded portion screwed in a threaded bore, so that rotation thereof can adjust the axial position relative to the roller 304 or the holding structure 308.

Figure 29:
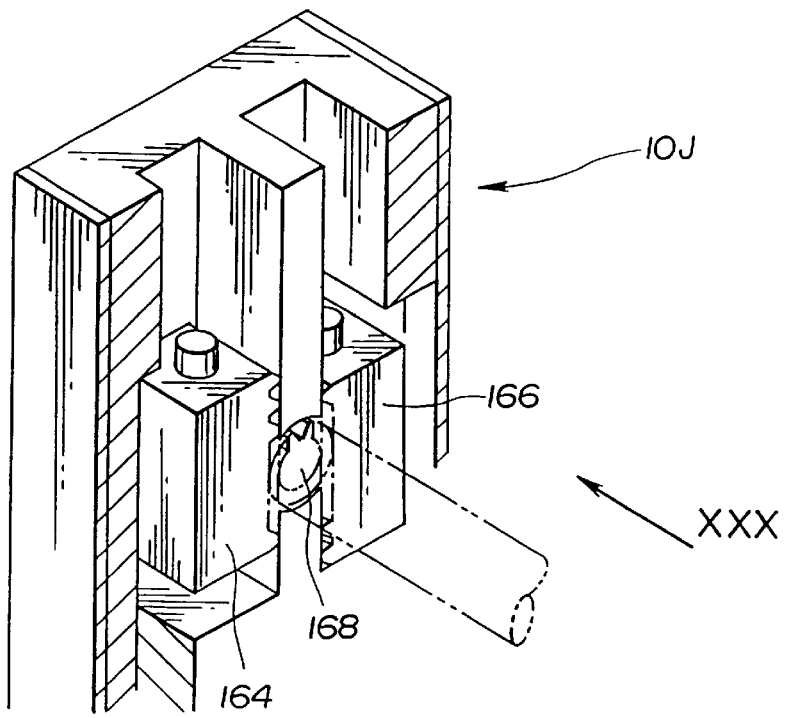
FIG. 29 is a partially cut perspective view of a part of the tenth embodiment where a rack-and-pinion mechanism is arranged.
Figure 30:
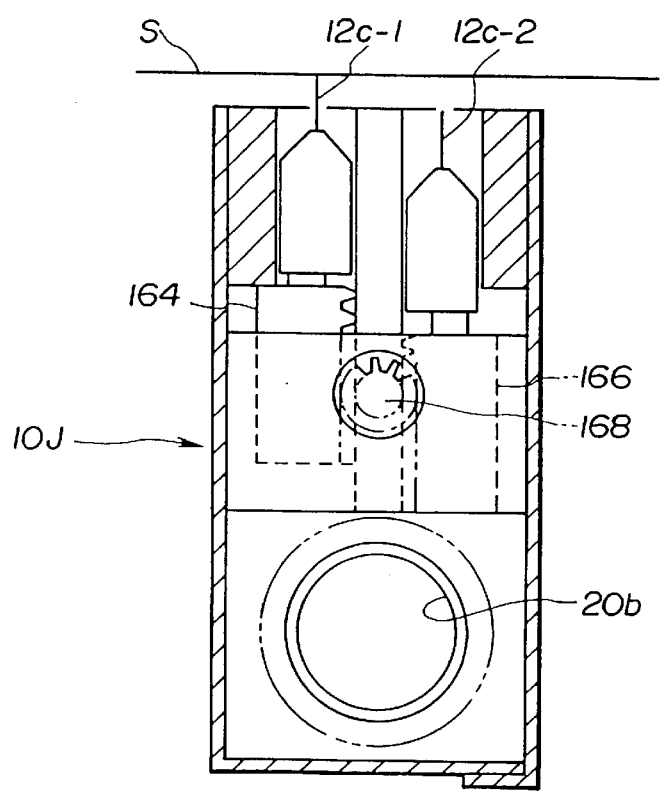
FIG. 30 is a view taken from the direction of the arrow "XXX" of FIG. 29.

Referring to FIGS. 29 and 30, there is shown the mechanism for pivotally actuating the two cleaning blades 12c-1 and 12c-2. As shown, the two blades 12c-1 and 12c-2 are respectively provided with the racks 164 and 164 by which the pinion 168 is operatively disposed. Thus, when the pinion 168 is rotated in a certain direction, one of the cleaning blades 12c-1 and 12c-2 is projected upward and the other is pulled down. This mechanism is also employed in the afore-mentioned fifth embodiment 10E of FIG. 13.

It is to be understood that, although the invention has been described with specific reference to particular embodiments thereof, it is not to be so limited since changes and alterations therein may be made which are within the full intended scope of this invention as defined by the appended claims.

What is claimed is:

1. A cleaning device for cleaning a screen plate used in a screen printing, comprising:

a base structure positioned below said screen plate;

a housing movably carried on said base structure;

a rotation shaft rotatably held in said housing, said rotation shaft having a plurality of cleaning blades disposed thereabout, each cleaning blade having a top adapted for contacting a lower surface of said screen plate; and a driver for rotating said rotation shaft.

2. A cleaning device as claimed in claim 1, further comprising:

a resiliently deformable strip against which said cleaning blades abut repeatedly when said rotation shaft is rotated by said driver.

3. A cleaning device as claimed in claim 2, further comprising:

a supplier providing solvent to said cleaning blades.

4. A cleaning device as claimed in claim 3, further comprising:

a suction source carrying any foreign things removed by said cleaning blades out to the outside.

5. A cleaning device as claimed in claim 4, in which said suction source comprises a tube connector possessed by said housing, said tube connector being adopted to be connected to a suction pump.

6. A cleaning device as claimed in claim 3, in which said supplier comprises:

a pipe installed in said housing, said pipe being connected with a solvent supply; and a solvent injecting clearance through which the solvent in said pipe is injected toward said cleaning blades.

7. A cleaning device as claimed in claim 6, in which said solvent injecting clearance comprises:

said resiliently deformable strip; and another resiliently deformable strip against which said cleaning blades abut repeatedly when said rotation shaft is rotated by said driver;

wherein the two resiliently deformable strips are mounted on said pipe in such a manner to define therebetween said solvent injection clearance, said solvent injection clearance communicating with an interior of said pipe.

8. A cleaning device as claimed in claim 2, further comprising:

cleaning rollers rotatably held in said housing and pressed against the lower surface of said screen plate;

a cleaning paper intimately put between each of said cleaning rollers and the lower surface of said screen plate; and a cleaning paper driving mechanism for moving the cleaning paper along a given traveling path which includes cylindrical outer surfaces of the cleaning rollers.

9. A cleaning device as claimed in claim 8, further comprising:

a solvent supplier for feeding the cleaning paper with a solvent.

10. A cleaning device as claimed in claim 9, in which said solvent supplier comprises:

a plurality of guide rollers rotatably held in a lower portion of said housing, said rollers putting thereon said cleaning paper for guiding said cleaning paper along said given traveling path; and a retainer keeping the solvent in the lower portion of said housing thereby wetting said cleaning paper with the solvent.

11. A cleaning device as claimed in claim 10, in which said cleaning paper driving mechanism drives both said rotation shaft and said cleaning paper.

12. A cleaning device as claimed in claim 11, in which said cleaning paper driving mechanism comprises:

a first toothed pulley coaxially connected to said rotation shaft to rotate therewith;

second and third toothed pulleys coaxially and respectively connected to said guide rollers to rotate therewith;

an endless toothed belt operatively connecting said first, second and third toothed pulleys; and an electric actuator for driving one of said first, second and third toothed pulleys.

13. A cleaning device as claimed in claim 12, in which said electric actuator comprises:

a gear train including a plurality of gears; and an electric motor for powering said gear train.

14. A cleaning device as claimed in claim 9, in which said solvent supplier comprises:

solvent injection nozzles arranged at front and rear positions of said housing, each nozzle being directed toward the lower surface of said screen plate; and an electromagnetic valve through which said solvent injection nozzles are connected to a solvent supply.

15. A cleaning device as claimed in claim 2, further comprising:

cleaning blades vertically movably held in said housing and pressed against the lower surface of said screen plate;

a cleaning paper intimately put between each of said cleaning blades and the lower surface of said screen plate; and a cleaning paper driving mechanism for moving the cleaning paper along a given traveling path that includes tops of said cleaning blades.

16. A cleaning device as claimed in claim 2, in which said driver comprises:

a first pulley connected to said rotation shaft to rotate therewith;

an electric motor having an output shaft;

a second pulley connected to said output shaft; and an endless belt operatively connecting said first and second pulleys.

* * * * *